US006967856B1

(12) United States Patent
Park et al.

(10) Patent No.: US 6,967,856 B1
(45) Date of Patent: Nov. 22, 2005

(54) CONTENT ADDRESSABLE MEMORY (CAM) DEVICES THAT UTILIZE SEGMENTED MATCH LINES AND WORD LINES TO SUPPORT PIPELINED SEARCH AND WRITE OPERATIONS AND METHODS OF OPERATING SAME

(75) Inventors: Kee Park, San Jose, CA (US); Scott Yu-Fan Chu, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 14 days.

(21) Appl. No.: 10/701,048

(22) Filed: Nov. 4, 2003

Related U.S. Application Data

(63) Continuation-in-part of application No. 10/323,236, filed on Dec. 18, 2002, now Pat. No. 6,760,242, and a continuation-in-part of application No. 10/464,598, filed on Jun. 18, 2003.

(60) Provisional application No. 60/371,491, filed on Apr. 10, 2002.

(51) Int. Cl.[7] .............................................. G11C 15/00
(52) U.S. Cl. ......................... 365/49; 365/203; 711/108
(58) Field of Search ..................... 365/49, 203, 230.03, 365/230.06; 711/108

(56) References Cited

U.S. PATENT DOCUMENTS

| | | | | |
|---|---|---|---|---|
| 5,327,372 A | | 7/1994 | Oka et al. | 315/49 |
| 5,440,715 A | | 8/1995 | Wyland | 395/435 |
| 5,446,685 A | | 8/1995 | Holst | 365/49 |
| 5,517,441 A | | 5/1996 | Dietz et al. | 365/49 |
| 5,598,115 A | | 1/1997 | Holst | 326/119 |
| 5,706,224 A | | 1/1998 | Srinivasan et al. | 365/49 |
| 5,852,569 A | | 12/1998 | Srinivasan et al. | 365/49 |
| 5,859,791 A | | 1/1999 | Schultz et al. | 365/49 |
| 5,936,873 A | * | 8/1999 | Kongetira | 365/49 |
| 5,964,857 A | | 10/1999 | Srinivasan et al. | 710/126 |
| 5,978,246 A | | 11/1999 | Shindo | 365/49 |
| 6,044,005 A | | 3/2000 | Gibson et al. | 365/49 |
| 6,101,115 A | | 8/2000 | Ross | 365/49 |
| 6,101,116 A | | 8/2000 | Lien et al. | 365/49 |
| 6,125,049 A | | 9/2000 | Nataraj | 365/49 |
| 6,128,207 A | | 10/2000 | Lien et al. | 365/49 |
| 6,147,891 A | | 11/2000 | Nataraj | 365/49 |
| 6,166,939 A | | 12/2000 | Nataraj et al. | 365/49 |
| 6,175,514 B1 | | 1/2001 | Henderson et al. | 365/49 |
| 6,191,969 B1 | | 2/2001 | Pereira | 365/49 |
| 6,191,970 B1 | | 2/2001 | Pereira | 365/49 |
| 6,195,278 B1 | | 2/2001 | Calin et al. | 365/49 |

(Continued)

*Primary Examiner*—David Lam
(74) *Attorney, Agent, or Firm*—Myers Bigel Sibley & Sajovec

(57) ABSTRACT

CAM devices include a segmented CAM array that is configured to support a long word search operation (e.g., x8N search) as a plurality of overlapping segment-to-segment search operations that are each performed across different rows within a group of rows in the CAM array and staggered in time relative to one another. To provide enhanced soft error immunity, these CAM devices may also include a CAM array having a row of lateral XY TCAM cells therein that are arranged in a repeating low-even, low-odd, high-even, high-odd sequence, where "low" and "high" represent the first and second halves of a CAM entry. Methods of operating a CAM device may include staggering the timing of overlapping segment-to-segment search operations across different rows within a CAM array using force-to-miss control signals to establish miss conditions on match lines of rows that are not to participate in a respective ones of the segment-to-segment search operations.

19 Claims, 15 Drawing Sheets

U.S. PATENT DOCUMENTS

| | | | | |
|---|---|---|---|---|
| 6,240,001 | B1 | 5/2001 | Ross | 365/49 |
| 6,243,280 | B1 | 6/2001 | Wong et al. | 365/49 |
| 6,243,281 | B1 | 6/2001 | Pereira | 365/49 |
| 6,246,601 | B1 | 6/2001 | Pereira | 365/49 |
| 6,252,789 | B1 | 6/2001 | Pereira et al. | 365/49 |
| 6,256,216 | B1 | 7/2001 | Lien et al. | 365/49 |
| 6,262,907 | B1 | 7/2001 | Lien et al. | 365/49 |
| 6,262,929 | B1 | 7/2001 | Miyatake et al. | 365/203 |
| 6,324,087 | B1 | 11/2001 | Pereira | 365/49 |
| 6,341,079 | B1 | 1/2002 | Chadwick | 365/49 |
| 6,343,029 | B1 | 1/2002 | Kengeri et al. | 365/49 |
| 6,349,049 | B1 | 2/2002 | Schoy | 365/49 |
| 6,362,993 | B1 | 3/2002 | Henderson et al. | 365/49 |
| 6,370,613 | B1 | 4/2002 | Diede et al. | 711/108 |
| 6,373,738 | B1 | 4/2002 | Towler et al. | 365/49 |
| 6,430,074 | B1 | 8/2002 | Srinivasan | 365/49 |
| 6,452,822 | B1 | 9/2002 | Chai et al. | 365/49 |
| 6,499,081 | B1 | 12/2002 | Nataraj et al. | 711/108 |
| 6,512,682 | B2 | 1/2003 | Cohen et al. | 363/146 |
| 6,560,670 | B1 | 5/2003 | Ichiriu | 711/108 |
| 6,584,003 | B1 | 6/2003 | Kim et al. | 365/49 |
| 6,597,596 | B2 | 7/2003 | Gordon et al. | 365/49 |
| 6,697,277 | B2 | 2/2004 | Towler et al. | 365/49 |
| 6,732,227 | B1 | 5/2004 | Baumann | 711/108 |
| 2003/0070039 | A1 | 4/2003 | Gillingham | 711/108 |
| 2003/0123269 | A1 | 7/2003 | Gillingham et al. | 365/49 |

* cited by examiner

FROM FIG. 8A

| SEGMENT A | SEGMENT B | SEGMENT C | SEGMENT D | TIME | SEGMENT D | SEGMENT C | SEGMENT B | SEGMENT A |
|---|---|---|---|---|---|---|---|---|
| **ROW0-SEGA0** | ROW3-SEGB6 | ROW3-SEGC6 | ROW0-SEGD4 | 0T to 0.5T | ROW0-SEGD5 | ROW3-SEGC7 | ROW3-SEGB7 | **ROW0-SEGA1** |
| **ROW0-SEGA0** | MASK | ROW3-SEGC6 | MASK | 0.5T to 1T | MASK | ROW3-SEGC7 | MASK | **ROW0-SEGA1** |
| **ROW0-SEGA0** | **ROW0-SEGB0** | ROW3-SEGC6 | ROW3-SEGD6 | 1T to 1.5T | ROW3-SEGD7 | ROW3-SEGC7 | **ROW0-SEGB1** | **ROW0-SEGA1** |
| MASK | **ROW0-SEGB0** | MASK | ROW3-SEGD6 | 1.5T to 2T | ROW3-SEGD7 | MASK | **ROW0-SEGB1** | MASK |
| **ROW1-SEGA2** | **ROW0-SEGB0** | **ROW0-SEGC0** | ROW3-SEGD6 | 2T to 2.5T | ROW3-SEGD7 | **ROW0-SEGC1** | **ROW0-SEGB1** | **ROW1-SEGA3** |
| **ROW1-SEGA2** | MASK | **ROW0-SEGC0** | MASK | 2.5T to 3T | MASK | **ROW0-SEGC1** | MASK | **ROW1-SEGA3** |
| **ROW1-SEGA2** | **ROW1-SEGB2** | **ROW0-SEGC0** | **ROW0-SEGD0** | 3T to 3.5T | **ROW0-SEGD1** | **ROW0-SEGC1** | **ROW1-SEGB3** | **ROW1-SEGA3** |
| MASK | **ROW1-SEGB2** | MASK | **ROW0-SEGD0** | 3.5T to 4T | **ROW0-SEGD1** | MASK | **ROW1-SEGB3** | MASK |
| **ROW2-SEGA4** | **ROW1-SEGB2** | **ROW1-SEGC2** | **ROW0-SEGD0** | 4T to 4.5T | **ROW0-SEGD1** | **ROW1-SEGC3** | **ROW1-SEGB3** | **ROW2-SEGA5** |
| **ROW2-SEGA4** | MASK | **ROW1-SEGC2** | MASK | 4.5T to 5T | MASK | **ROW1-SEGC3** | MASK | **ROW2-SEGA5** |
| **ROW2-SEGA4** | **ROW2-SEGB4** | **ROW1-SEGC2** | **ROW1-SEGD2** | 5T to 5.5T | **ROW1-SEGD3** | **ROW1-SEGC3** | **ROW2-SEGB5** | **ROW2-SEGA5** |
| MASK | **ROW2-SEGB4** | MASK | **ROW1-SEGD2** | 5.5T to 6T | **ROW1-SEGD3** | MASK | **ROW2-SEGB5** | MASK |
| **ROW3-SEGA6** | **ROW2-SEGB4** | **ROW2-SEGC4** | **ROW1-SEGD2** | 6T to 6.5T | **ROW1-SEGD3** | **ROW2-SEGC5** | **ROW2-SEGB5** | **ROW3-SEGA7** |
| **ROW3-SEGA6** | MASK | **ROW2-SEGC4** | MASK | 6.5T to 7T | MASK | **ROW2-SEGC5** | MASK | **ROW3-SEGA7** |
| **ROW3-SEGA6** | **ROW3-SEGB6** | **ROW2-SEGC4** | **ROW2-SEGD4** | 7T to 7.5T | **ROW2-SEGD5** | **ROW2-SEGC5** | **ROW3-SEGB7** | **ROW3-SEGA7** |
| MASK | **ROW3-SEGB6** | MASK | **ROW2-SEGD4** | 7.5T to 8T | **ROW2-SEGD5** | MASK | **ROW3-SEGB7** | MASK |
| ROW0-SEGA0 | **ROW3-SEGB6** | **ROW3-SEGC6** | **ROW2-SEGD4** | 8T to 8.5T | **ROW2-SEGD5** | **ROW3-SEGC7** | **ROW3-SEGB7** | ROW0-SEGA1 |
| ROW0-SEGA0 | MASK | **ROW3-SEGC6** | MASK | 8.5T to 9T | MASK | **ROW3-SEGC7** | MASK | ROW0-SEGA1 |
| ROW0-SEGA0 | ROW0-SEGB0 | **ROW3-SEGC6** | **ROW3-SEGD6** | 9T to 9.5T | **ROW3-SEGD7** | **ROW3-SEGC7** | ROW0-SEGB1 | ROW0-SEGA1 |
| MASK | ROW0-SEGB0 | MASK | **ROW3-SEGD6** | 9.5T to 10T | **ROW3-SEGD7** | MASK | ROW0-SEGB1 | MASK |
| ROW1-SEGA2 | ROW0-SEGB0 | ROW0-SEGC0 | **ROW3-SEGD6** | 10T to 10.5T | **ROW3-SEGD7** | ROW0-SEGC1 | ROW0-SEGB1 | ROW1-SEGA3 |
| ROW1-SEGA2 | MASK | ROW0-SEGC0 | MASK | 10.5T to 11T | MASK | ROW0-SEGC1 | MASK | ROW1-SEGA3 |

FIG. 10C

CONTENT ADDRESSABLE MEMORY (CAM) DEVICES THAT UTILIZE SEGMENTED MATCH LINES AND WORD LINES TO SUPPORT PIPELINED SEARCH AND WRITE OPERATIONS AND METHODS OF OPERATING SAME

REFERENCE TO PRIORITY APPLICATIONS

This application is a continuation-in-part (CIP) of U.S. application Ser. No. 10/323,236, filed Dec. 18, 2002 now U.S. Pat. No. 6,760,242, which claims the benefit of U.S. Provisional Application Ser. No. 60/371,491, filed Apr. 10, 2002. This application is also a continuation-in-part (CIP) of U.S. application Ser. No. 10/464,598, filed Jun. 18, 2003. The disclosures of U.S. application Ser. Nos. 10/323,236 and 10/464,598 are hereby incorporated herein by reference.

FIELD OF THE INVENTION

The present invention relates to integrated circuit memory devices and methods of operating same, and more particularly to content addressable memory devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a compare operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Conventional techniques to reduce power consumption within CAM devices are disclosed in U.S. Pat. Nos. 6,191,969 and 6,191,970 to Pereira. In particular, the '969 patent discloses a CAM array having CAM cells therein that include a discharge circuit connected between each cell and a fixed ground potential. Each of the discharge circuits includes a control terminal coupled to receive a control signal indicative of the logical state of a match line segment in a respective row. These discharge circuits may be turned off to prevent discharge of respective match line segments during a search operation. U.S. Pat. No. 6,243,280 to Wong et al. also discloses a technique to selectively precharge match line segments during a search operation. However, the match line precharge circuit described in the '280 patent may suffer from relatively poor speed performance during a search operation. This poor speed performance may result whenever a wider timing margin is used in each stage of a search operation to account for worst case timing conditions. These worst case timing conditions can occur when only one CAM cell within a segment of CAM cells indicates a "miss" condition while all other CAM cells in the same segment indicate "match" conditions. Thus, in the '280 patent, the timing margin associated with each stage of a search operation should be sufficient to account for the presence of a "worst case" miss signal before a decision can be made on whether to precharge a match line segment associated with a next segment of CAM cells. U.S. Pat. No. 6,430,074 to Srinivasan discloses a precharge circuit that uses selective look-ahead match line precharging techniques. The following patents also disclose subject matter relating to match line precharging: U.S. Pat. Nos. 6,101,115; 6,125,049; 6,147,891; 6,166,939; 6,240,001; 6,262,929 and 6,343,029.

U.S. Pat. No. 5,517,441 to Dietz et al. discloses the use of inverters and pull-down transistors to pass match line signals from one match line segment to another match line segment during a search operation. U.S. Pat. Nos. 5,446,685 and 5,598,115 to Holst also disclose the use of rail-to-rail (i.e., Vdd-to-Vss) pulsed ground signals during search operations. These pulsed ground signals may facilitate selective match line discharge operations.

A conventional match line signal repeater is illustrated by FIG. 1. In particular, FIG. 1 illustrates a segmented row of CAM cells 10 that utilizes serially connected inverters I1–I4 to pass match line signals from lower match line segments to upper match line segments during a search operation. The segmented row 10 is illustrated as including three equal-length match line segments (x10 MLa, x10 MLB and x10 MLc) that are each electrically coupled to respective segments of CAM cells 12*a*, 12*b* and 12*c*. Prior to commencement of a search operation, a plurality of active low precharge signals (PRECHARGE 1–3) are switched high-to-low in sequence during a precharge time interval. When this occurs, PMOS precharge transistors P1–P3 turn on in sequence and precharge the three match line segments to logic 1 levels (e.g., Vdd). During this precharge time interval, pairs of differential comparand data lines (not shown), which are electrically connected to the segments of CAM cells 12*a*, 12*b* and 12*c*, are globally masked (i.e., both the true and complementary data lines within each pair are pulled low). A search word is then applied to the data lines to commence a search operation. During the search operation, at least one match line segment is pulled low if one or more miss conditions exist in the illustrated row 10. A worst case timing scenario may exist when only the leftmost CAM cell in the row 10 (i.e., CAM cell 0) indicates a miss and all other CAM cells (i.e., CAM cells 1–29) indicate a match (often referred to as a "hit"). When this occurs, a gradual pull-down of the first match line segment x10 MLa is accelerated from left-to-right across the match line segments x10 MLB and x10 MLc, by the inverters I1–I4. Thus, the inverters I1–I4, which may be designed to have relatively strong pull-down paths, can operate to increase the pull-down speed of the match line segments and thereby improve the worst case timing characteristics when search operations are performed.

Content addressable memories may also be designed to provide inter-row configurability that enables short word search operations (e.g., x72) and long word search operations (e.g., x144, x288, etc.) to be performed. In particular, FIG. 1 of U.S. Pat. No. 6,252,789 to Pereira et al. illustrates CAM arrays having width expansion logic (WEL) circuits that support long word search operations. The '789 patent describes a long word as a data word chain having a first data word (FW) and a last word (LW) and possibly one or more continuing data words (CW). Each WEL circuit is illustrated as include a match carry input (MCI) and a match carry output (MCO), which are configured to support the passing of match carry signals from one row of a CAM array to a next row of a CAM array during consecutive search operations. CAM cells are also used for storing control bits, including a start bit (ST) and an end bit (END). The start bit indicates that the corresponding data word is the first word in a data word chain and the end bit indicates that the data word is the last word in the data word chain.

Notwithstanding these conventional techniques to improve match line signal speed and reduce match line power consumption in segmented CAM arrays, there continues to be a need for additional techniques to further reduce power consumption and achieve high speed operation of CAM arrays having segmented match lines.

SUMMARY OF THE INVENTION

Embodiments of the present invention include CAM devices that utilize advanced timing and power saving techniques to support high frequency search operations within large capacity CAM arrays. In some embodiments, segmented CAM arrays are provided with low power match line signal repeaters that support high speed pipelined search operations in an efficient manner. An exemplary match line signal repeater includes a dual-capture match line signal repeater that extends between xR and xS segments of CAM cells within a respective row, where R and S are positive integers. This repeater provides high speed operation by quickly accessing the state (match or miss) of a match line segment when a corresponding segment of CAM cells connected to the match line segment undergoes a respective stage of a pipelined search operation. If the match line segment is initially assessed as having a match signal thereon, then that match signal is passed to a next match line segment within the same row and a next stage search operation is commenced. However, if the match line segment is erroneously assessed as having a match signal thereon, when a miss condition was actually present in the corresponding segment of CAM cells, then the signal repeater will operate to capture a late miss signal and pass that late miss signal to the next higher match line segment, and thereby correct the error.

In particular, a dual-capture match line signal repeater may be configured to: (i) transfer a "early" match signal from a xR match line segment to a next higher xS match line segment during an early capture time interval; and then (ii) transfer the "late" miss signal, if present, from the xR match line segment to the xS match line segment during a late capture time interval that terminates after termination of the early capture time interval. In this manner, an early assessment of a match condition can be made in order to shorten the per-stage search cycle time. However, if the early assessment is erroneous because a worst case miss condition was actually present (resulting in a weak miss signal that is represented by a relatively gradual high-to-low transition of the match line), then the erroneous assessment is corrected and provided to the next segment of CAM cells while that next segment is undergoing the next stage of the search operation. However, because such an erroneous assessment is typically rare, the benefit of shorter search latency more than adequately compensates for the infrequent case when match line power is not conserved.

Additional embodiments of the present invention include methods of performing pipelined search operations within a segmented CAM array. These methods may include applying a first segment of a search word to first data lines that are electrically coupled to the first segment of CAM cells during a first stage of the pipelined search operation. Then, after a relatively short evaluation time period has elapsed, an early match signal, if present, is passed from a first match line segment associated with the first segment of CAM cells to a second match line segment associated with a second segment of CAM cells. This passing of the match signal may be performed while second data lines, which are electrically coupled to the second segment of CAM cells, are globally masked. Then, during a second stage of the pipelined search operation, a second segment of the search word is applied to the second data lines and a late miss signal is simultaneously passed from the first match line segment to the second match line segment, to thereby correct for the early passing of an erroneous match signal.

Still further embodiments of the present invention include CAM devices that support long word search operations (e.g., x2N, x4N, x8N, etc., where N is a logical width of a CAM array). These CAM devices include a segmented CAM array that is configured to support a long word search operation as a plurality of overlapping segment-to-segment search operations. Each of these operations is performed across different rows within a group of rows in the CAM array and is staggered in time relative to one another, frequently by one or two search segment time intervals. The control of which rows are searched and which rows are ignored during a segment-to-segment search operation is provided by force-to-miss control signals. These control signals force miss conditions onto match lines associated with rows that are to be ignored during a segment-to-segment search operation. In this manner, the long word search operations may be pipelined in two-dimensions (2D), along a segment-to-segment (i.e., horizontal) search direction and a row-to-row (i.e., vertical) search direction where only selected rows are searched in each segment-to-segment search operation.

These CAM devices may also have high degrees of soft-error immunity. In particular, each CAM entry within a CAM array may have four bits of parity data associated with it that identify the parity of different portions of the entry. Moreover, to make the most of these four bits of parity data in terms of soft error immunity, each row of TCAM cells within a CAM array may be arranged (by column) in a repeating low-even, low-odd, high-even, high-odd sequence, where "low" represents one half of a CAM entry (e.g., bits 0–39) and "high" represents another half of the CAM entry (e.g., bits 40–79).

BRIEF DESCRIPTION OF THE DRAWINGS

FIG. 10C is a detailed block diagram that illustrates the timing of the operations of FIG. 10B, according to further embodiments of the present invention.

DETAILED DESCRIPTION OF PREFERRED EMBODIMENTS

Figure 1:
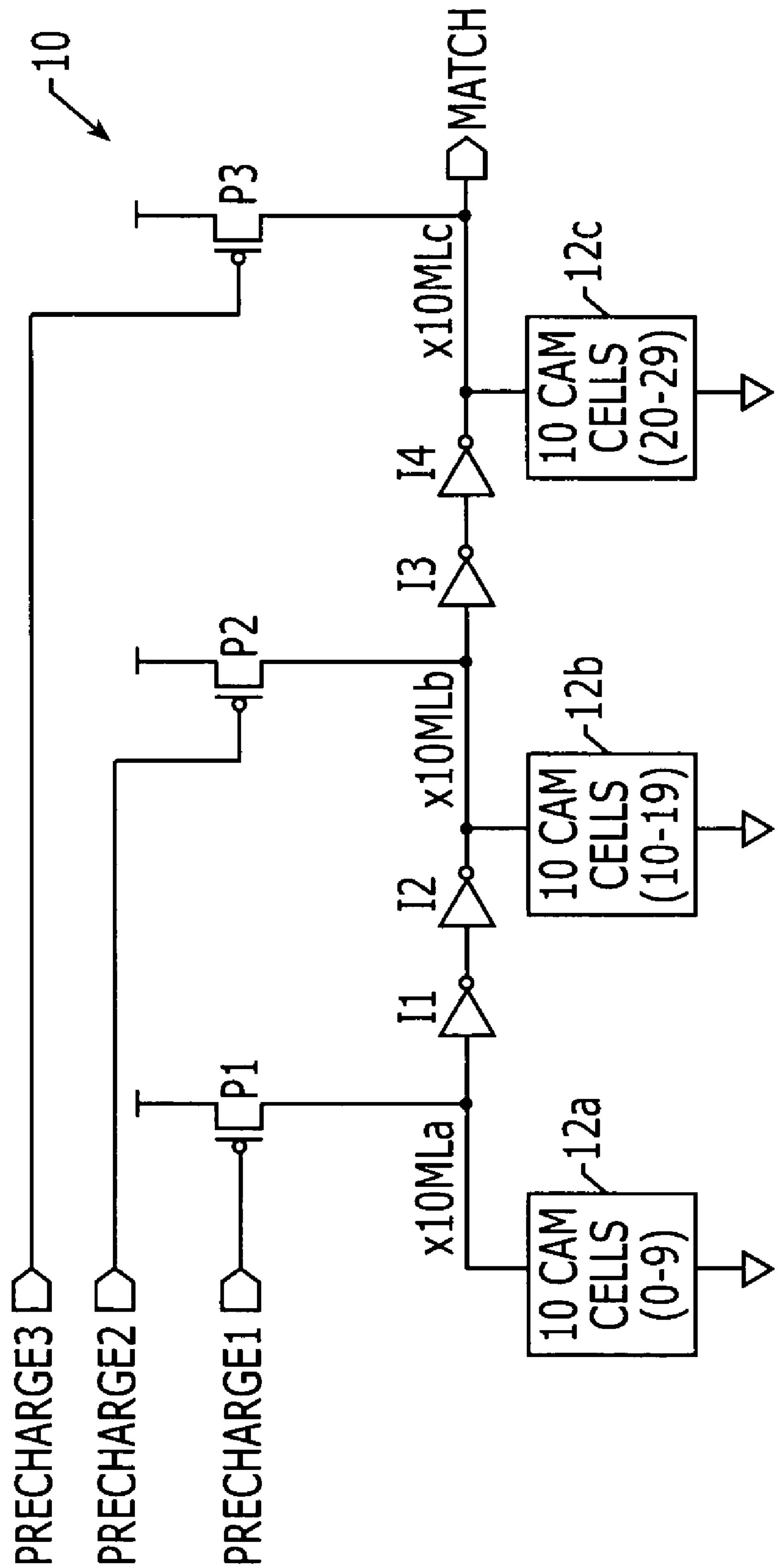
FIG. 1 is an electrical schematic of a row of CAM cells having a match line signal repeater therein, according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figures 2, 2A:
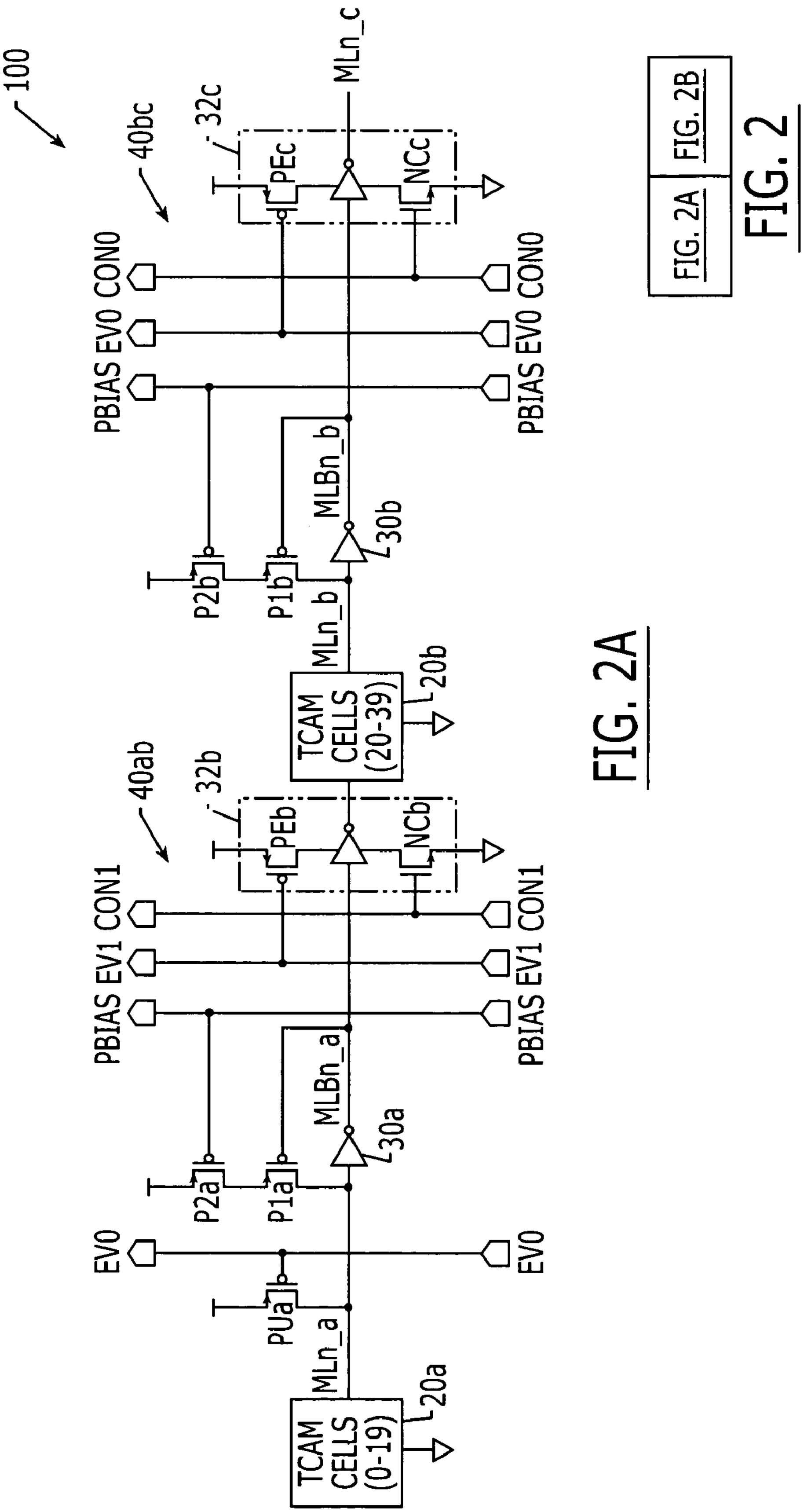
FIG. 2 is an electrical schematic of a row of CAM cells having a dual-capture match line signal repeater therein according to embodiments of the present invention. This row is divided into two halves, with FIG. 2A illustrating a left half (columns <0:39>) and FIG. 2B illustrating a right half (columns <40:79>).
Figure 4:
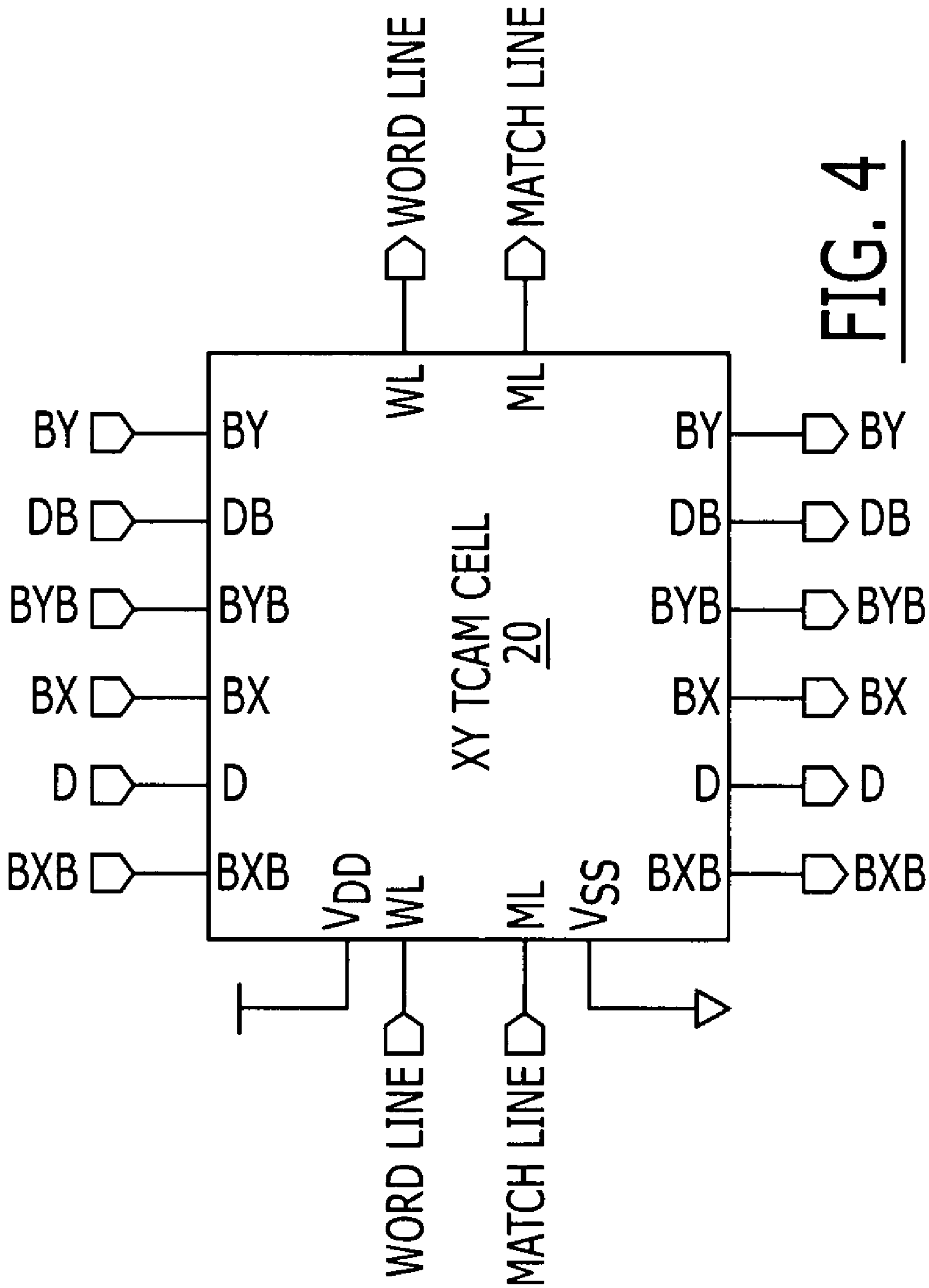
FIG. 4 is a block diagram of an XY ternary CAM (TCAM) cell that may be used in the embodiment of FIG. 2.

Referring now to FIG. 2, a content addressable memory (CAM) array having a segmented row 100 of CAM cells therein will be described. The row 100, which has been segmented into four equal width segments, is illustrated as having a logical width of 80 CAM cells, however, additional cells (not shown) may be added to one or more segments in order to provide column redundancy. Thus, in the illustrated embodiment, the segments each have a logical width of 20 CAM cells. These segments of CAM cells are described herein as a x20a segment, which spans columns 0–19, a x20b segment, which spans columns 20–39, a x20c segment, which spans columns 40–59, and a x20d segment, which spans columns 60–79. Other configurations of rows having a different number of segments and segments of unequal width are also possible. As illustrated by FIG. 4, the CAM cells may constitute ternary CAM (TCAM) cells, however, binary and quaternary CAM cells may also be used. In particular, FIG. 4 illustrates an XY TCAM cell 20 that is connected to two pairs of bit lines ((BX, BXB) and (BY, BYB)) and one pair of data lines (D, DB). The bit lines provide write data (or read data) to (or from) the CAM array during write (or read) operations. In contrast, the data lines provide comparand data (i.e., search words) to the CAM array during search operations. The XY CAM cell 22 is also illustrated as being connected to a respective word line (WL), a respective match line (ML), a power supply line Vdd and a ground reference line Vss.

The CAM cells in FIG. 2 are grouped according to segment. The first segment of CAM cells 20*a*, which spans columns 0–19 of the array, is electrically connected to a first x20a match line segment (shown as MLn_a, where "n" designates the row number). The second segment of CAM cells 20*b*, which spans columns 20–39 of the array, is electrically connected to a second x20b match line segment (shown as MLn_b). The third segment of CAM cells 20*c*, which spans columns 40–59 of the array, is electrically connected to a third x20c match line segment (shown as MLn_c). Finally, the fourth segment of CAM cells 20*d*, which spans columns 60–79 of the array, is electrically connected to a fourth x20d match line segment (shown as MLn_d).

A dual-capture match line signal repeater is provided between each of the illustrated match line segments. In particular, a first dual-capture match line signal repeater 40*ab* is provided between the match line segments MLn_a and MLn_b, a second dual-capture match line signal repeater 40*bc* is provided between match line segments MLn_b and MLn_c, and a third dual-capture match line signal repeater 40*cd* is provided between match line segments MLn_c and MLn_d.

The first signal repeater 40*ab* is illustrated as including a first inverter 30*a* and a second inverter 32*b*. The first inverter 30*a* may be defined internally by one PMOS pull-up transistor and one NMOS pull-down transistor. In contrast, the second inverter 32*b*, which has a tri-state output, includes a pull-up path defined by two PMOS pull-up transistors and a pull-down path defined by two NMOS pull-down transistors. An input of the second inverter 32*b* is electrically connected to an output of the first inverter 30*a* by the first complementary match line segment MLBn_a. As illustrated, the uppermost PMOS pull-up transistor PEb within the second inverter 32*b* has a gate terminal that is responsive to a first evaluation control signal (shown as EV1). The lowermost NMOS pull-down transistor NCb within the second inverter 32*b* has a gate terminal that is responsive to a first connect control signal (shown as CON1).

The second signal repeater 40*bc* is illustrated as including a first inverter 30*b* and a second inverter 32*c*. The first inverter 30*b* may be defined internally by one PMOS pull-up transistor and one NMOS pull-down transistor. The second inverter 32*c*, which has a tri-state output, includes a pull-up path defined by two PMOS pull-up transistors and a pull-down path defined by two NMOS pull-down transistors. An input of the second inverter 32*c* is electrically connected to an output of the first inverter 30*b* by the second complementary match line segment MLBn_b. As illustrated, the uppermost PMOS pull-up transistor PEc within the second inverter 32*c* has a gate terminal that is responsive to a zeroth evaluation control signal (shown as EV0). The lowermost NMOS pull-down transistor NCc within the second inverter 32*c* has a gate terminal that is responsive to a zeroth connect control signal (shown as CON0). These evaluation and connect control signals may be generated by timing and control circuitry (not shown) that is synchronized to a clock signal (e.g., CLK2X), as illustrated by the timing diagram 50 of FIG. 3.

The third signal repeater 40*cd* is illustrated as including a first inverter 30*c* and a second inverter 32*d*. The first inverter 30*c* may be defined internally by one PMOS pull-up transistor and one NMOS pull-down transistor. The second inverter 32*d*, which has a tri-state output, includes a pull-up path defined by two PMOS pull-up transistors and a pull-down path defined by two NMOS pull-down transistors. As illustrated, the uppermost PMOS pull-up transistor PEd within the second inverter 32*d* has a gate terminal that is responsive to the first evaluation control signal (shown as EV1). The lowermost NMOS pull-down transistor NCd within the second inverter 32*d* has a gate terminal that is responsive to the first connect control signal (shown as CON1).

The first match line segment MLn_a is precharged to a logic 1 voltage (e.g., Vdd) just prior to commencement of a first stage of a pipelined search operation. This precharging operation is performed by PMOS pull-up transistor PUa, which is responsive to the zeroth evaluation control signal EV0. As described more fully hereinbelow with respect to the timing diagram 50 of FIG. 3 and TABLES 1 and 2, a leading edge of the zeroth evaluation control signal, which is an active low signal, will operate to commence precharge of the first match line segment MLn_a. A pair of serially connected PMOS pull-up transistors P1*a* and P2*a* are also provided to support the first match line segment MLn_a at its precharged level, by offsetting leakage current losses that may occur in the first segment of CAM cells 20*a*. As illustrated, a first current carrying terminal of the PMOS pull-up transistor P1*a* (shown as a drain terminal) is electrically connected to the first match line segment MLn_a and a gate terminal of the PMOS pull-up transistor P1*a* is electrically connected to an output of the first inverter 30*a*. The gate terminal of the PMOS pull-up transistor P2*a* is responsive to a bias signal (shown as PBIAS), which may be a signal having an adjustable or one time programmable (e.g., fuse programmable) dc voltage level (e.g., $0<V_{PBIAS}<0.5(Vdd)$). The order of the pull-up transistors P1*a* and P2*a* may be reversed. The operating characteristics of the PMOS pull-up transistors P1*a* and P2*a* are more fully described in commonly assigned U.S. application Ser. No. 10/323,236, filed Dec. 18, 2002, the disclosure of which is hereby incorporated herein by reference.

A second pair of serially connected PMOS pull-up transistors P1*b* and P2*b* are also provided to support any positive voltage on the second match line segment MLn_b, by offsetting leakage current losses that may occur in the second segment of CAM cells 20*b*. Similarly, a third pair of serially connected PMOS pull-up transistors P1*c* and P2*c* are provided to support any positive voltage on the third match line segment MLn_c during search operations. Finally, a fourth pair of serially connected PMOS pull-up transistors P1*d* and P2*d* are provided to support any positive voltage on the fourth match line segment MLn_d during search operations. The fourth match line segment MLn_d terminates at an input of a final inverter 30*d*, which passes a match/miss result to an input of a x80 capture latch 42. As illustrated, the switching of the x80 capture latch 42 is synchronized with a trailing edge of the zeroth connect control signal CON0. The capture latch 42 generates a final active low match line signal MLBn, which may be provided to a priority encoder using conventional techniques.

Figure 3:
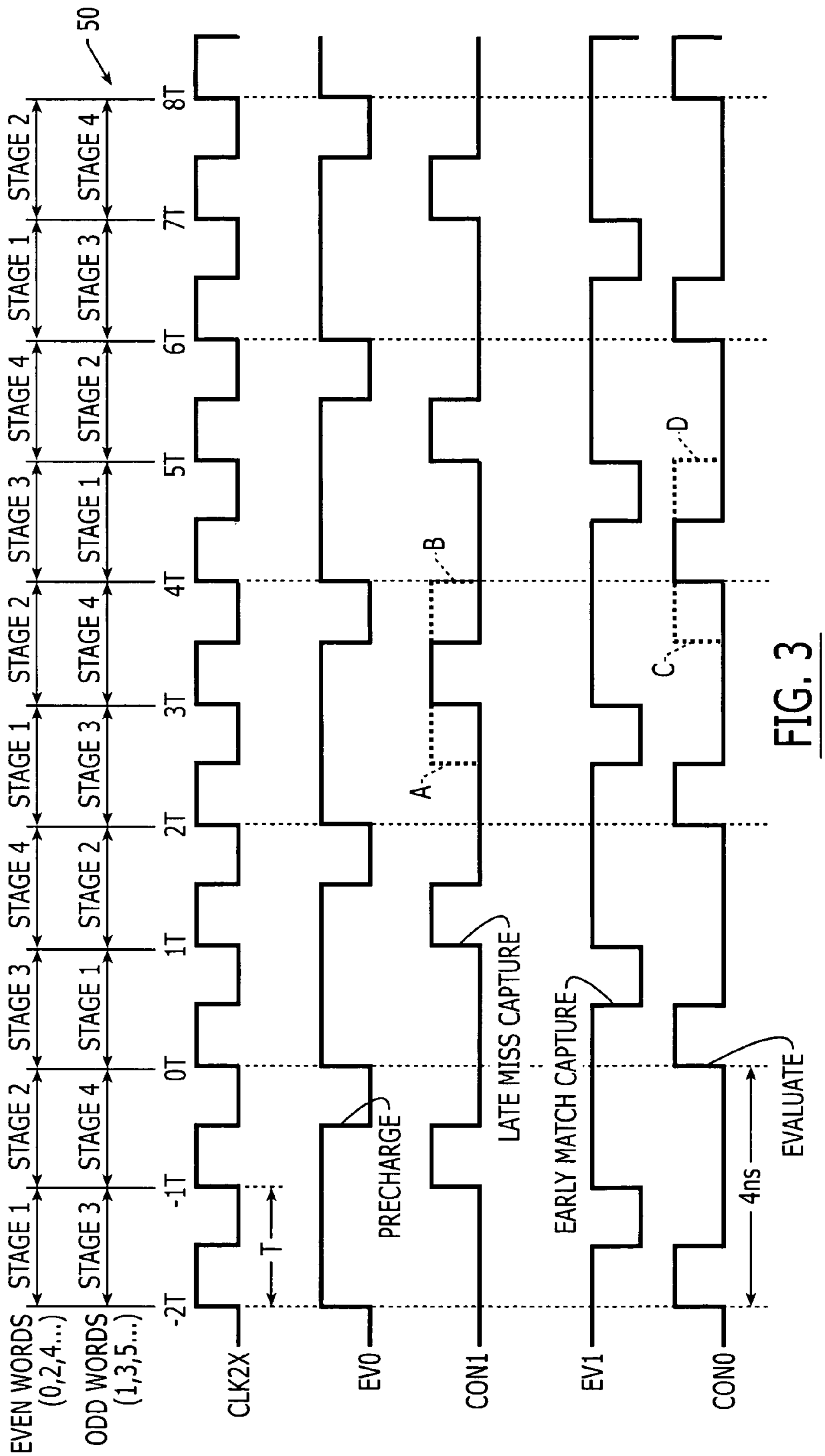
FIG. 3 is a timing diagram that illustrates the timing of control signals applied to the dual-capture match line signal repeater of FIG. 2, according to additional embodiments of the present invention.

Operations performed within the segmented row 100 of CAM cells illustrated by FIG. 2 will now be described more fully with reference to the timing diagram 50 of FIG. 3 and the search operations illustrated by TABLES 1 and 2. In particular, FIG. 3 illustrates the timing of five signals: CLK2X (a synchronizing clock signal having a period of T=2 ns), the zeroth evaluation control signal EV0, the first connect control signal CON1, the first evaluation control signal EV1 and the zeroth connect control signal CON0. As described above, the evaluation control signals EV0 and EV1 are active low signals and the connect control signals CON0 and CON1 are active high signals.

When the zeroth evaluation control signal EV0 switches high-to-low, the first match line segment MLn_a is precharged high to a logic 1 level and the PMOS pull-up transistor PEc within the second inverter 32*c* is turned on to enable pull-up of the third match line segment MLn_c (when the second complementary match line segment MLBn_b is maintained at a logic 0 level). When the first evaluation control signal EV1 switches high-to-low, the PMOS pull-up transistor PEb within the second inverter 32*b* is turned on to enable pull-up of the second match line segment MLn_b (when the first complementary match line segment MLBn_a is maintained at a logic 0 level). Switching the first evaluation control signal EV1 high-to-low also causes the PMOS pull-up transistor PEd within the second inverter 32*d* to turn on and enable pull-up of the fourth match line segment MLn_d (when the third complementary match line segment MLBn_c is maintained at a logic 0 level).

When the zeroth connect control signal CON0 is switched low-to-high, the NMOS pull-down transistor NCc within the second inverter 32*c* is turned on to enable pull-down of the third match line segment MLn_c (when the second complementary match line segment MLBn_b switches to (or is held at) a logic 1 level). When the first connect control signal CON1 is switched low-to-high, the NMOS pull-down transistor NCb within the second inverter 32*b* is turned on to enable pull-down of the second match line segment MLn_b (when the first complementary match line segment MLBn_a switches to (or is held at) a logic 1 level). Switching the first connect control signal CON1 low-to-high also causes the NMOS pull-down transistor NCd within the second inverter 32*d* to turn on and thereby enable pull-down of the fourth match line segment MLn_d (when the third complementary match line segment MLBn_c switches to (or is held at) a logic 1 level). In addition, switching the zeroth connect control signal CON0 high-to-low causes the x80 capture latch 42 to capture the signal at the output of the final inverter 30*d*. This captured signal is reflected as the final match line signal MLBn.

Referring specifically now to the entries within TABLES 1 and 2 and the timing diagram 50 of FIG. 3, STAGE 1 of a pipelined search operation with respect to an odd search word (e.g., WORD1) and STAGE 3 of a pipelined search operation with respect to an even search word (e.g., WORD0) occur during the time interval from 0 T to 1 T, which spans 2 ns. During the time interval 0 T to 0.5 T, bits <0:19> of WORD1 are applied to the 20 pairs of differential data lines (D/DB<0:19>) associated with the first segment of CAM cells 20*a* and bits <40:59> of WORD0 are simultaneously applied to the 20 pairs of differential data lines (D/DB<40:59>) associated with the third segment of CAM cells 20*c*. This application of data commences two side-by-side partial word search operations. Just prior to time 0 T, the bit lines D/DB<0:19> and <40:59> are held low to represent a global mask condition.

When the first segment of WORD1 is applied to the data lines D/DB<0:19>, the first match line segment MLn_a will be pulled low (i.e., discharged) from a precharged high level if one or more miss conditions are present in the first segment of CAM cells 20*a*. A "worst" case miss condition exists from a timing standpoint when only CAM cell<0> in the leftmost column of the CAM array detects a miss condition and all other CAM cells<1:19> detect a match condition (i.e., hit). In this case, CAM cell<0> will be solely responsible for pulling down the entire first match line segment MLn_a. Similar "worst" case miss conditions may also exist whenever only a single cell miss condition is present in one of the CAM cells<1:19>. When the third segment of WORD 0 is applied to the data lines D/DB<40:59>, the third match line segment MLn_c will be pulled low (or held low) if one or more miss conditions are present in the third segment of CAM cells 20*a*.

Also during the time interval from 0 T to 0.5 T, the previously applied bits <20:39> of WORD0 remain on the differential data lines (D/DB<20:39>) associated with the second segment of CAM cells 20*b* and the previously applied bits <60:79> of WORD(−1) remain on the differential data lines (D/DB<60:79>) associated with the fourth segment of CAM cells 20*d*. In addition, because the first evaluation control signal EV1 is inactive at a logic 1 level and the first connect control signal CON1 is inactive at a logic 0 level during the time interval from 0 T to 0.5 T, the tri-state output of second inverter 32*b* and the tri-state output of second inverter 32*d* will be disposed in high impedance states. This will isolate the first match line segment MLn_a from the second match line segment MLn_b (i.e., x20a ML and x20b ML are isolated from each other) and also isolate the third match line segment MLn_c from the fourth match line segment MLn_d (i.e., x20c ML and x20d ML are isolated from each other).

Moreover, because the zeroth connect control signal CON0 switches low-to-high at time 0 T, any miss signal generated on the second match line segment MLn_b (during a prior STAGE 2 of the search operation with respect to WORD0) will be captured as this miss signal passes through the second inverter 32*c*. In particular, if a miss is present from the prior stage, then the second complementary match line segment MLBn_b will be high and the NMOS pull-down transistor NCc associated with the second inverter 32*c* will be turned on in response to the low-to-high switching of the zeroth connect control signal CON0. This will cause the output of the second inverter 32*c* to pull (or hold) the third match line segment MLn_c segment low. In many cases, the third match line segment MLn_c segment will not need to be pulled low if it already was low during an immediately prior stage of a search operation. Thus, switching CON0 low-to-high enables the capture of a late miss signal from the second match line segment MLn_b during STAGE 3 of the search operation with respect to WORD 0. Switching the zeroth connect control signal CON0 low-to-high also operates to capture the output of the final inverter 30*d*, which represents a x80 match condition with respect to a prior word (WORD(−1)) that has finished a fourth stage of its search.

According to a preferred aspect of the match line signal repeaters, if a high-to-low transition of the second match line segment MLn_b is relatively gradual in response to a respective STAGE 2 of a search operation, then the low-to-high transition of the second complementary match line signal MLBn_b may also be relatively gradual, but nonetheless recognized by the second inverter 32*c* when the NMOS pull-down transistor NCc turns on in response to the active zeroth connect control signal CON0. As described herein, a match signal represents a logic 1 signal on a match line and a miss signal represents a logic 0 signal on a match line. In contrast, a "late" miss signal can represent either a "strong" miss signal that is captured late (relative to a match signal) or a "weak" miss signal that is captured late. A "weak" miss signal represents a logic 0 signal that was developed slowly on a match line (i.e., the high-to-low transition of the match line is not sufficiently abrupt to classify the transition as a "strong" miss signal having a sharp falling edge).

At the commencement of the time interval from 0.5 T to 1 T, the zeroth connect control signal CON0 switches high-to-low (at time 0.5 T) to thereby turn off NMOS transistor NCc within the second inverter 32*c*. The first evaluation control signal EV1 also switches high-to-low to thereby turn on PMOS pull-up transistor PEb (within the second inverter 32*b*) and PMOS pull-up transistor PEd (within the second inverter 32*d*). This enables the "early" capture and passing of any logic 1 match signal from the first match line segment MLn_a to the second match line MLn_b, while data lines D/DB<20:39> are being globally masked (in preparation for STAGE 2 of the search operation with respect to WORD1). This also enables the "early" capture and passing of any logic 1 match signal from the third match line segment MLn_c to the fourth match line MLn_d, while data lines D/DB<60:79> are being globally masked (in preparation for STAGE 4 of the search operation with respect to WORD0). During this time interval from 0.5 T to 1 T, the second match line segment MLn_b will be isolated from the third match line segment MLn_c (because EV0=1 and CON0=0 and the output of the second inverter 32*c* is tri-stated), the first segment of WORD1 will remain on data lines D/DB<0:19> and the third segment of WORD0 will remain on data lines D/DB<40:59>.

STAGE 2 of a pipelined search operation with respect to search WORD1 and STAGE 4 of a pipelined search operation with respect to search WORD0 occur during the time interval from 1 T to 2 T. At the time point 1 T, the first evaluation control signal EV1 switches low-to-high and the first connect control signal CON1 switches low-to-high. This enables a late miss signal, if any, to be passed from the first segment of CAM cells 20*a* to the second segment of CAM cells 20*b* (i.e., passed through second inverter 32*b*). This also enables a late miss signal, if any, to be passed from the third segment of CAM cells 20*c* to the fourth segment of CAM cells 20*d* (i.e., passed through second inverter 32*d*). Moreover, because the zeroth evaluation control signal EV0 and the zeroth connect control signal CON0 are held high and low, respectively, during the interval from 1 T to 1.5 T, the second match line segment MLn_b remains isolated from the third match line segment MLn_c.

During the STAGE 2 and STAGE 4 time intervals, bits <20:39> of WORD1 are applied to the 20 pairs of differential data lines (D/DB<10:39>) associated with the second segment of CAM cells 20*b* and bits <60:79> of WORD0 are simultaneously applied to the 20 pairs of differential data lines (D/DB<60:79>) associated with the fourth segment of CAM cells 20*d*. This application of data commences two side-by-side partial word search operations. In addition, the first segment of WORD1 (i.e., bits <0:19>) is maintained on the first segment of data lines D/DB<0:19> and the third segment of WORD0 (i.e., bits <40:59>) is maintained on the third segment of data lines D/DB<40:59>.

When the second segment of WORD1 is applied to the data lines D/DB<20:39> during STAGE 2, the second match line segment MLn_b will be pulled high-to-low (i.e., discharged) if STAGE 1 resulted in a match condition and one or more miss conditions are present in the second segment of CAM cells 20*b*. Alternatively, the second match line segment MLn_b will be pulled high-to-low if STAGE 1 resulted in an early capture of an erroneous match signal during the time interval 0.5 T to 1 T, followed by late capture of a "weak" miss signal during the time interval 1 T to 1.5 T. Finally, the second match line segment MLn_b will remain low during STAGE 2 if it was low at the beginning of STAGE 2 and STAGE 1 did not result in an early capture of a match signal during the time interval 0.5 T to 1 T.

Likewise, when the fourth segment of WORD0 is applied to the data lines D/DB<60:79> during STAGE 4, the fourth match line segment MLn_d will be pulled high-to-low (i.e., discharged) if STAGE 3 resulted in a match condition and one or more miss conditions are present in the fourth segment of CAM cells 20*d*. Alternatively, the fourth match line segment MLn_d will be pulled high-to-low if STAGE 3 resulted in an early capture of an erroneous match signal during the time interval 0.5 T to 1 T, followed by late capture of a "weak" miss signal during the time interval 1 T to 1.5 T. Finally, the fourth match line segment MLn_d will remain low during STAGE 4 if it was low at the beginning of STAGE 4 and STAGE 3 did not result in an early capture of a match signal during the time interval 0.5 T to 1 T.

Next, at the commencement of the time interval from 1.5 T to 2 T, the first connect control signal CON1 switches high-to-low (at time 1.5 T) to thereby turn off NMOS transistor NCb within the second inverter 32*b* and NMOS transistor NCd within the second inverter 32*d*. This operates to isolate the first match line MLn_a from the second match line MLn_b and also isolate the third match line from the fourth match line MLn_d. At time 1.5 T, the zeroth evaluation control signal EV0 switches high-to-low to thereby turn on PMOS pull-up transistor PUa (which precharges the first match line segment MLn_a and prepares it for STAGE 1 of a search operation) and turn on PMOS pull-up transistor PEc (within the second inverter 32*c*). This turn on of PMOS pull-up transistor PEc enables the "early" capture and passing of any logic 1 match signal from the second match line segment MLn_b to the third match line MLn_c, while data lines D/DB<40:59> are globally masked (in preparation for STAGE 3 of the search operation with respect to WORD1) and the second segment of WORD0 is maintained on the data lines D/DB<20:39>. The fourth segment of WORD0 is also maintained on data lines D/DB<60:79> during the time interval from 1.5 T to 2 T, to thereby support capture of a final match condition with respect to WORD 0 during the next time interval from 2 T to 2.5 T (See, e.g., TABLE 2).

STAGES 3 and 4 of the pipelined search operations with respect to WORD1 are next performed during the time intervals from 2 T–3 T and 3 T–4 T, respectively. These operations repeat the STAGE 3 operations and STAGE 4 operations described above with respect to WORD0. Moreover, during these final stage operations with respect to WORD1, STAGE 1 operations and STAGE 2 operations are performed with respect to a new word, WORD2. Accordingly, as illustrated best by the timing diagram of FIG. 3 and TABLE 2, the odd words (WORD1, WORD3, . . . ) are searched in a first repeating STAGE1–STAGE4 sequence that spans 8 ns and the even words (WORD0, WORD2, . . . ) are searched in a second repeating STAGE1–STAGE4 sequence that is time shifted relative to the first repeating sequence by a time interval of 2 T (4 ns).

TABLE 1

| | |
|---|---|
| 0 T to 0.5 T | APPLY SEARCH WORD1<0:19> |
| STAGES 1 & 3 | DISCHARGE x20A ML if x20A MISS |
| (EVAL) | MAINTAIN SEARCH WORD0<20:39> ON D/DB<20:39> |
| (LATE CAPTURE) | APPLY SEARCH WORD0<40:59> |
| | DISCHARGE x20C ML if x20C MISS and/or x20B LATE MISS CAPTURE |
| | MAINTAIN SEARCH WORD(−1)<60:79> ON D/DB<60:79> |
| | CAPTURE x80 MATCH/MISS (WORD(−1)) |
| | ISOLATE x20A ML FROM x20B ML & ISOLATE x20C ML FROM x20D ML |
| 0.5 T to 1 T | MAINTAIN SEARCH WORD1<0:19> ON D/DB<0:19> |
| (EARLY CAPTURE) | PASS EARLY CAPTURE OF MATCH TO x20B ML |
| | GLOBALLY MASK D/DB<20:39> |
| | MAINTAIN SEARCH WORD0<40:59> ON D/DB<40:59> |
| | PASS EARLY CAPTURE OF MATCH TO x20D ML |
| | GLOBALLY MASK D/DB<60:79> |
| | ISOLATE x20B ML FROM x20C ML |
| 1 T to 1.5 T | MAINTAIN SEARCH WORD1<0:19> ON D/DB<0:19> |
| STAGES 2 & 4 | APPLY SEARCH WORD1<20:39> |
| (EVAL) | DISCHARGE x20B ML if x20B MISS and/or x20A LATE MISS CAPTURE |
| (LATE CAPTURE) | MAINTAIN SEARCH WORD0<40:59> ON D/DB<40:59> |
| | APPLY SEARCH WORD0<60:79> |
| | DISCHARGE x20D ML if x20D MISS and/or x20C LATE MISS CAPTURE |
| | ISOLATE x20B ML FROM x20C ML |
| 1.5 T to 2 T | PRECHARGE x20A ML |
| (EARLY CAPTURE) | GLOBALLY MASK D/DB<0:19> |
| | MAINTAIN SEARCH WORD1<20:39> of D/DB<20:39> |
| | PASS EARLY CAPTURE OF MATCH TO x20C ML |
| | GLOBALLY MASK D/DB<40:59> |
| | MAINTAIN SEARCH WORD0<60:79> ON D/DB<60:79> |
| | ISOLATE x20A ML FROM x20B ML & ISOLATE x20C ML FROM x20D ML |

TABLE 2

| | | |
|---|---|---|
| 0 T to 0.5 T | APPLY SEARCH WORD1<0:19> | APPLY SEARCH WORD0<40:59> |
| STAGES 1 & 3 | MAINTAIN SEARCH WORD(−1)<60:79> ON D/DB<60:79> | MAINTAIN SEARCH WORD0<20:39> ON D/DB<20:39> |
| | CAPTURE x80 MATCH/MISS (WORD(−1)) | ISOLATE x20A ML FROM x20B ML & ISOLATE x20C ML FROM x20D ML |
| | DISCHARGE x20A ML if x20A MISS | DISCHARGE x20C ML if x20C MISS and/or x20B LATE MISS CAPTURE |
| 0.5 T to 1 T | PASS EARLY CAPTURE OF MATCH TO x20B ML | PASS EARLY CAPTURE OF MATCH TO x20D ML |
| | GLOBALLY MASK D/DB<20:39> & ISOLATE x20B ML FROM x20C ML | GLOBALLY MASK D/DB<60:79> |
| 1 T to 1.5 T | APPLY SEARCH WORD1<20:39> | APPLY SEARCH WORD0<60:79> |
| STAGES 2 & 4 | MAINTAIN SEARCH WORD1<0:19> ON D/DB<0:19> | MAINTAIN SEARCH WORD0<40:59> ON D/DB<40:59> |
| | ISOLATE x20B ML FROM x20C ML | |
| | DISCHARGE x20B ML if x20B MISS and/or x20A LATE MISS CAPTURE | DISCHARGE x20D ML if x20D MISS and/or x20C LATE MISS CAPTURE |
| 1.5 T to 2 T | PASS EARLY CAPTURE OF MATCH TO x20C ML | PRECHARGE x20A ML |
| | GLOBALLY MASK D/DB<40:59> & ISOLATE x20C ML FROM x20D ML | GLOBALLY MASK D/DB<0:19> & ISOLATE x20A ML FROM x20B ML |
| 2 T to 2.5 T | APPLY SEARCH WORD1<40:59> | APPLY SEARCH WORD2<0:19> |
| STAGES 3 & 1 | MAINTAIN SEARCH WORD1<20:39> ON D/DB<20:39> | MAINTAIN SEARCH WORD0<60:79> ON D/DB<60:79> |
| | ISOLATE x20A ML FROM x20B ML & ISOLATE x20C ML FROM x20D ML | CAPTURE x80 MATCH/MISS (SEARCH WORD0) |
| | DISCHARGE x20C ML if x20C MISS and/or x20B LATE MISS CAPTURE | DISCHARGE x20A ML if x20A MISS |
| 2.5 T to 3 T | PASS EARLY CAPTURE OF MATCH TO x20D ML | PASS EARLY CAPTURE OF MATCH TO x20B ML |
| | GLOBALLY MASK D/DB<60:79> | GLOBALLY MASK D/DB<20:39> & ISOLATE x20B ML FROM x20C ML |
| 3 T to 3.5 T | APPLY SEARCH WORD1<60:79> | APPLY SEARCH WORD2<20:39> |
| STAGES 4 & 2 | MAINTAIN SEARCH WORD1<40:59> ON D/DB<40:59> | MAINTAIN SEARCH WORD2<0:19> ON D/DB<0:19> |
| | ISOLATE x20B ML FROM x20C ML | |
| | DISCHARGE x20D ML if x20D MISS and/or x20C LATE MISS CAPTURE | DISCHARGE x20B ML if x20B MISS and/or x20A LATE MISS CAPTURE |

TABLE 2-continued

| | | |
|---|---|---|
| 3.5 T to 4 T | PRECHARGE x20A ML | PASS EARLY CAPTURE OF MATCH TO x20C ML |
| | GLOBALLY MASK D/DB<0:19> & ISOLATE x20A ML FROM x20B ML | GLOBALLY MASK D/DB<40:59> & ISOLATE x20C ML FROM x20D ML |
| 4 T to 4.5 T | APPLY SEARCH WORD3<0:19> | APPLY SEARCH WORD2<40:59> |
| STAGES 1 & 3 | MAINTAIN SEARCH WORD1<60:79> ON D/DB<60:79> | MAINTAIN SEARCH WORD2<20:39> ON D/DB<20:39> |
| | CAPTURE x80 MATCH/MISS (SEARCH WORD1) | ISOLATE x20A ML FROM x20B ML & ISOLATE x20C ML FROM x20D ML |
| | DISCHARGE x20A ML IF x20A MISS | DISCHARGE x20C ML if x20C MISS and/or x20B LATE MISS CAPTURE |
| 4.5 T to 5 T | PASS EARLY CAPTURE OF MATCH TO x20B ML | PASS EARLY CAPTURE OF MATCH TO x20D ML |
| | GLOBALLY MASK D/DB<20:39> & ISOLATE x20B ML FROM x20C ML | GLOBALLY MASK D/DB<60:79> |
| 5 T to 5.5 T | APPLY SEARCH WORD3<20:39> | APPLY SEARCH WORD2<60:79> |
| STAGES 2 & 4 | MAINTAIN SEARCH WORD3<0:19> ON D/DB<0:19> | MAINTAIN SEARCH WORD2<40:59> ON D/DB<40:59> |
| | ISOLATE x20B ML FROM x20C ML | |
| | DISCHARGE x20B ML if x20B MISS and/or x20A LATE MISS CAPTURE | DISCHARGE x20D ML if x20D MISS and/or x20C LATE MISS CAPTURE |
| 5.5 T to 6 T | PASS EARLY CAPTURE OF MATCH TO x20C ML | PRECHARGE x20A ML |
| | GLOBALLY MASK D/DB<40:59> & ISOLATE x20C ML FROM x20D ML | GLOBALLY MASK D/DB<0:19> & ISOLATE x20A ML FROM x20B ML |
| 6 T to 6.5 T | APPLY SEARCH WORD3<40:59> | APPLY SEARCH WORD4<0:19> |
| STAGES 3 & 1 | MAINTAIN SEARCH WORD3<20:39> ON D/DB<20:39> | MAINTAIN SEARCH WORD2<60:79> ON D/DB<60:79> |
| | ISOLATE x20A ML FROM x20B ML & ISOLATE x20C ML FROM x20D ML | CAPTURE x80 MATCH/MISS (SEARCH WORD2) |
| | DISCHARGE x20C ML if x20C MISS and/or x20B LATE MISS CAPTURE | DISCHARGE x20A ML if x20A MISS |
| 6.5 T to 7 T | PASS EARLY CAPTURE OF MATCH TO x20D ML | PASS EARLY CAPTURE OF MATCH TO x20B ML |
| | GLOBALLY MASK D/DB<60:79> | GLOBALLY MASK D/DB<20:39> & ISOLATE x20B ML FROM x20C ML |
| 7 T to 7.5 T | APPLY SEARCH WORD3<60:79> | APPLY SEARCH WORD4<20:39> |
| STAGES 4 & 2 | MAINTAIN SEARCH WORD3<40:59> ON D/DB<40:59> | MAINTAIN SEARCH WORD4<0:19> ON D/DB<0:19> |
| | ISOLATE x20B ML FROM x20C ML | |
| | DISCHARGE x20D ML if x20D MISS and/or x20C LATE MISS CAPTURE | DISCHARGE x20B ML if x20B MISS and/or x20A LATE MISS CAPTURE |
| 7.5 T to 8 T | PRECHARGE x20A ML | PASS EARLY CAPTURE OF MATCH TO x20C ML |
| | GLOBALLY MASK D/DB<0:19> & ISOLATE x20A ML FROM x20B ML | GLOBALLY MASK D/DB<40:59> & ISOLATE x20C ML FROM x20D ML |
| 8 T to 8.5 T | APPLY SEARCH WORD5<0:19> | APPLY SEARCH WORD4<40:59> |
| STAGES 1 & 3 | MAINTAIN SEARCH WORD3<60:79> ON D/DB<60:79> | MAINTAIN SEARCH WORD4<20:39> ON D/DB<20:39> |
| | CAPTURE x80 MATCH/MISS (SEARCH WORD3) | ISOLATE x20A ML FROM x20B ML & ISOLATE x20C ML FROM x20D ML |
| | DISCHARGE x20A ML IF x20A MISS | DISCHARGE x20C ML if x20C MISS and/or x20B LATE MISS CAPTURE |

The timing diagram of FIG. 3 also demonstrates alternative embodiments that modify the timing of the connect control signals CON0 and CON1. For example, the dotted lines A and B in FIG. 3 represent an earlier rising edge and a later falling edge of the first connect control signal CON1, respectively. Similarly, the dotted lines C and D in FIG. 3 represent an earlier rising edge and a later falling edge of the zeroth connect control signal CON0, respectively. In the event the connect control signal CON0 (CON1) has a rising edge as shown by the dotted line C (A), then the dual-capture match line signal repeater will operate to capture early miss signals and early match signals during the same time intervals. Nonetheless, late capture of late miss signals will still be provided. Moving the rising edges of the connect control signals CON0 and CON1 forward in time as shown by the dotted lines C and A, respectively, may be less preferred because it typically results in greater power consumption, particularly if the second inverters 32$b$, 32$c$ and 32$d$ are switched slowly in response to "weak" miss signals (gradual high-to-low transition of a respective match line segment). Slow switching of an inverter results in higher current consumption because it causes a direct resistive path to form between the power supply lines (Vdd and Vss) when the PMOS and NMOS transistors are simultaneously conductive.

As illustrated by TABLE 3, each CAM array includes a bit line and data line driver circuit (not shown) that drives the data lines (D/DB<0:79>) with segments of the search words (WORDn) during the pipelined search operations. These data line driving operations are interleaved with global masking operations that may be implemented using a dedicated mask cell sub-array containing global mask cells. An exemplary dedicated mask cell sub-array is more fully described in commonly assigned U.S. application Ser. No. 10/386,400, filed Mar. 11, 2003, the disclosure of which is hereby incorporated herein by reference.

TABLE 3

| STAGES | TIME | D/DB<0:19> | D/DB<20:39> | D/DB<40:59> | D/DB<60:79> |
|---|---|---|---|---|---|
| 1 AND 3 | 0 T to 0.5 T | WORD 1 | WORD 0 | WORD 0 | WORD −1 |
| | 0.5 T to 1 T | WORD 1 | MASK | WORD 0 | MASK |
| 2 AND 4 | 1 T to 1.5 T | WORD 1 | WORD 1 | WORD 0 | WORD 0 |
| | 1.5 T to 2 T | MASK | WORD 1 | MASK | WORD 0 |
| 3 AND 1 | 2 T to 2.5 T | WORD 2 | WORD 1 | WORD 1 | WORD 0 |
| | 2.5 T to 3 T | WORD 2 | MASK | WORD 1 | MASK |
| 4 AND 2 | 3 T to 3.5 T | WORD 2 | WORD 2 | WORD 1 | WORD 1 |
| | 3.5 T to 4 T | MASK | WORD 2 | MASK | WORD 1 |
| 1 AND 3 | 4 T to 4.5 T | WORD 3 | WORD 2 | WORD 2 | WORD 1 |
| | 4.5 T to 5 T | WORD 3 | MASK | WORD 2 | MASK |
| 2 AND 4 | 5 T to 5.5 T | WORD 3 | WORD 3 | WORD 2 | WORD 2 |
| | 5.5 T to 6 T | MASK | WORD 3 | MASK | WORD 2 |
| 3 AND 1 | 6 T to 6.5 T | WORD 4 | WORD 3 | WORD 3 | WORD 2 |
| | 6.5 T to 7 T | WORD 4 | MASK | WORD 3 | MASK |
| 4 AND 2 | 7 T to 7.5 T | WORD 4 | WORD 4 | WORD 3 | WORD 3 |
| | 7.5 T to 8 T | MASK | WORD 4 | MASK | WORD 3 |
| 1 AND 3 | 8 T to 8.5 T | WORD 5 | WORD 4 | WORD 4 | WORD 3 |
| | 8.5 T to 9 T | WORD 5 | MASK | WORD 4 | MASK |
| 2 AND 4 | 9 T to 9.5 T | WORD 5 | WORD 5 | WORD 4 | WORD 4 |
| | 9.5 T to 10 T | MASK | WORD 5 | MASK | WORD 4 |

The segmented row 100 of CAM cells illustrated by FIG. 2 may also be grouped with other rows of CAM cells in order to support long word search operations. In preferred embodiments, the rows within a group are immediately adjacent rows, however, rows that are spaced apart from each other may also be used. Accordingly, if a CAM array has a logical width of xN, then a plurality of segmented rows of CAM cells may be grouped together within a single CAM array (or multiple CAM arrays) to support long word search operations using x2N, x4N, x6N and x8N search words, for example.

Referring now to FIG. 5, an electrical schematic of a quad group 200 of segmented rows of CAM cells within a CAM array will be described. In the event the CAM array has a logical width equal to x80, the quad group 200 of rows can be configured to perform x80, x160 and x320 search operations. Moreover, in the event the CAM array is one-half of a CAM array pair within a CAM array block, then x80, x160, x320 and x640 search operations may be performed collectively by the quad group 200 in one CAM array (e.g., left side of CAM array pair) and its mirror image in another CAM array (e.g., right side of CAM array pair), as described more fully hereinbelow with respect to FIGS. 10A–10C.

The quad group 200 is illustrated as spanning rows 0–3 of a CAM array. Thus, a CAM array having a depth of 1024 rows may include 256 quad groups of rows, with group 0 spanning rows 0–3, group 1 spanning rows 4–7, . . . , and group 255 spanning rows 1020–1023. The rows of CAM cells are illustrated as being segmented into four segments of CAM cells, with interconnecting circuitry therebetween. These segments of CAM cells are illustrated as segments A and B in FIG. 5A and segments C and D in FIG. 5B. In alternative embodiments, the number of segments should exceed two in order to obtain sufficiently short cycle times within a pipelined search operation. The CAM cells within segment A are electrically coupled to a respective match line segment, which is illustrated as MLn_a, where n represents the row number. Similarly, the CAM cells within segments B, C and D are electrically coupled to match line segments MLn_b, MLn_c and MLn_d, respectively. These match line segments may have about the same length, as illustrated by FIGS. 9A–9D. The CAM cells within segments A and B are electrically connected to a first local word line segment, shown as WLn_ab, and the CAM cells within segments C and D are electrically connected to a second word line segment, shown as WLn_cd. Thus, the illustrated local word line segments may be about twice as long as the match line segments, or even longer in the event the rows of the CAM array contain non-CAM cells (see, e.g., FIG. 9A).

Figure 6A:
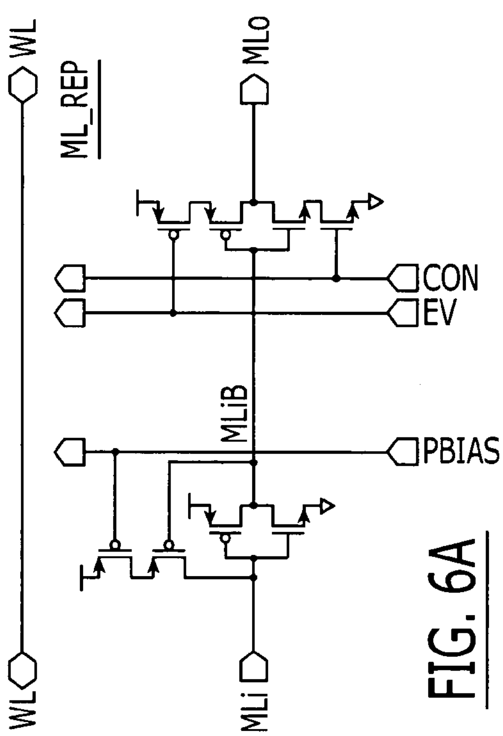
FIG. 6A is an electrical schematic of a dual-capture match line signal repeater (ML_REP) according to embodiments of the present invention.
Figure 6B:
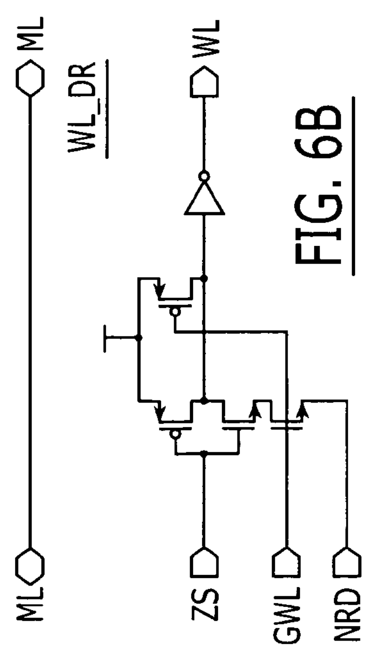
FIG. 6B is an electrical schematic of a local word line driver (WL_DR) according to embodiments of the present invention.
Figure 6C:
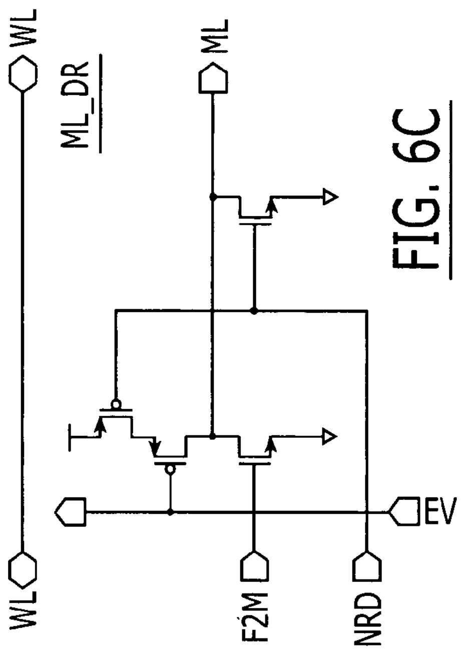
FIG. 6C is an electrical schematic of a match line driver (ML_DR) according to embodiments of the present invention. The match line driver (ML_DR) is responsive to an active high force-to-miss signal.

Each row of CAM cells is further illustrated as including a match line driver (ML_DR), three match line signal repeaters (ML_REP) and two word line drivers (WL_DR). Exemplary embodiments of the match line signal repeaters, word line drivers and match line drivers are more fully illustrated by FIGS. 6A, 6B and 6C, respectively. The match line signal repeater ML_REP of FIG. 6A corresponds to the dual-capture match line signal repeaters 40*ab*, 40*bc* and 40*cd* illustrated by FIG. 2. The match line driver ML_DR of FIG. 6C is related in function to the PMOS pull-up transistor PUa illustrated on the left-side of FIG. 2A.

Figure 5A:
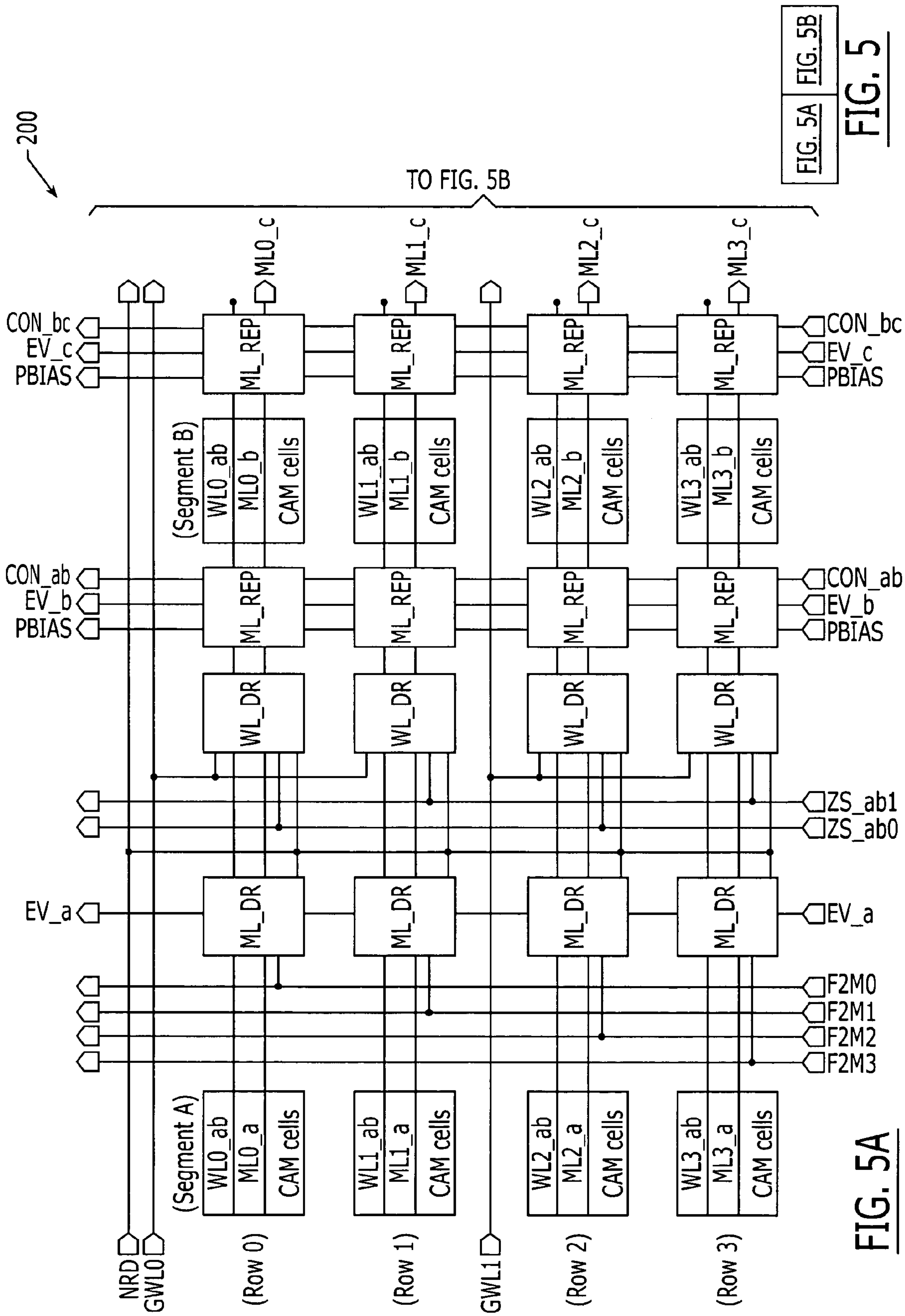
FIG. 5 is an electrical schematic of a quad group of rows of CAM cells within a segmented CAM array, according to embodiments of the present invention.

The match line driver ML_DR in row 0 is responsive to an evaluation control signal (shown as EV_a), a force-to-miss control signal (shown as F2M0) and a normal-row-disable signal NRD. The normal-row-disable signal NRD is held at a logic 0 level when the corresponding quad group 200 is active and is held at a logic 1 level when the corresponding quad group is disabled (e.g., permanently replaced by a redundant group of rows). The logic value of signal NRD may be set by a fuse in response to prepackage testing of an integrated circuit chip containing the CAM array. For purposes of discussion herein, the signal NRD will be treated as being held at a logic 0 level (e.g., Vss) at all times. As illustrated by FIGS. 5A and 6C, the first match line segment ML0_a in row 0 is precharged to Vdd when the evaluation control signal EV_a switches high-to-low to commence a precharge time interval (see, e.g., the precharge time intervals from 5 –6 ns, 9–10 ns, 29–30 ns, 33–34 ns and 37–38 ns in FIG. 7). If applied during a segment-to-segment search of another row, a leading edge of the active high force-to-miss control signal F2M0 will operate to discharge the first match line segment ML0_a in row 0 or otherwise hold the first match line segment ML0_a in a discharged state. Both the act of discharging a fully or partially pre-charged signal line to a ground reference potential (e.g., Vss) and the act of shorting an already fully discharged signal line to a ground reference potential will be referred to herein as "discharging" a signal line.

Figure 5B:
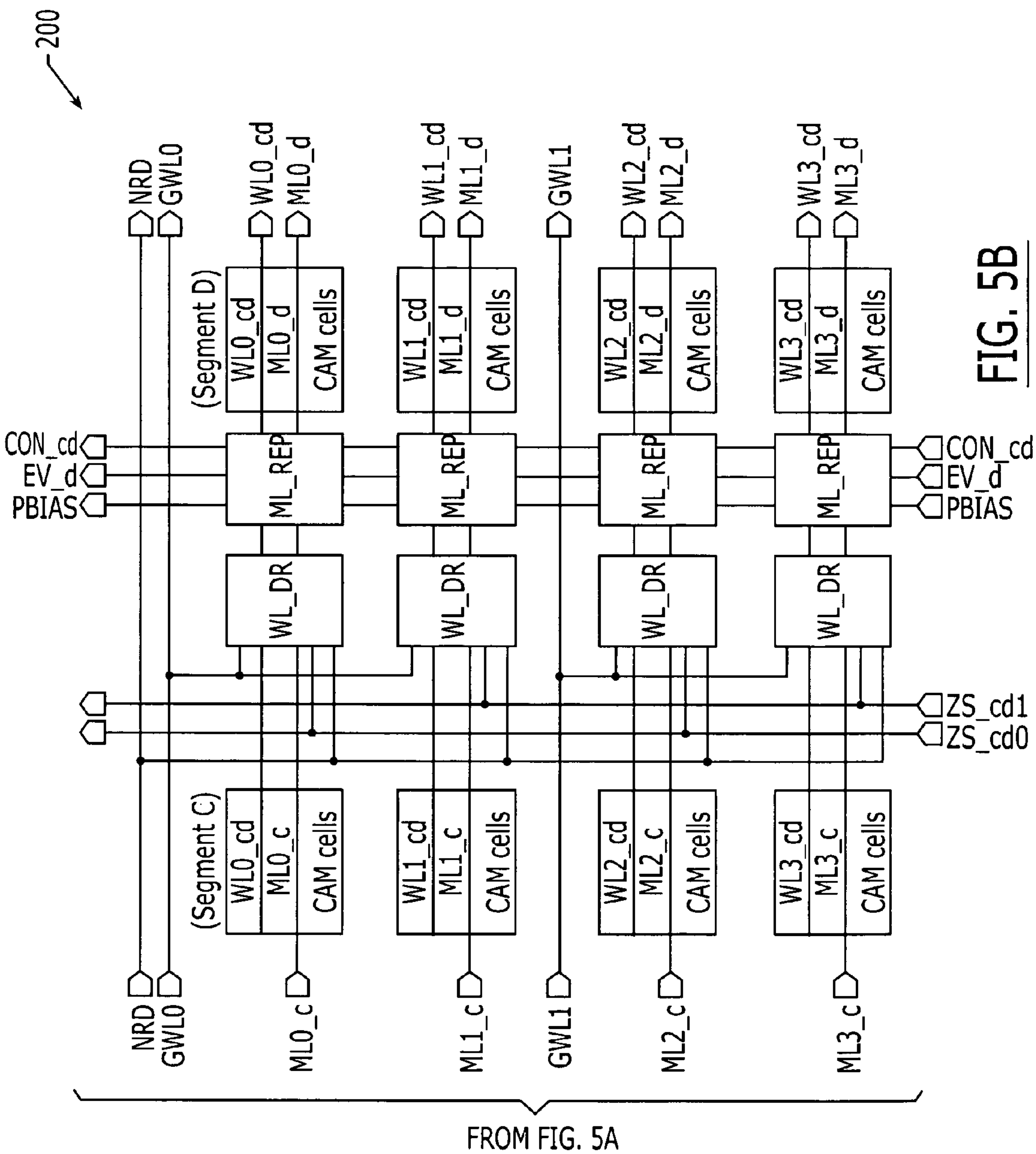

A first word line driver WL_DR in row 0 has an output that is electrically connected to a first local word line segment WL0_ab, which spans segments A and B of row 0. As illustrated by FIGS. 5A and 6B, this first word line driver WL_DR is responsive to a global word line control signal GWL0, the normal-row-disable signal NRD and a local word line control signal ZS_ab0. The first word line driver WL_DR in row 0 operates to drive the first local word line segment WL0_ab high only when both the global word line control signal GWL0 and the local word line control signal ZS_ab0 are both set at active high levels. Thus, an operation to write a segment of data (e.g., a x40 segment) into the CAM cells in segments A and B of row 0 requires that GWL0=ZS_ab0=1 and NRD=0. A second word line driver WL_DR in row 0 has an output that is electrically connected to a second local word line segment WL0_cd, which spans segments C and D of row 0. As illustrated by FIGS. 5B and 6B, this second word line driver WL_DR is responsive to the global word line control signal GWL0, the normal-row-disable signal NRD and a local word line control signal ZS_cd0. The second word line driver WL_DR in row 0 operates to drive the second local word line segment WL0_cd high only when both the global word line control signal GWL0 and the local word line control signal ZS_cd0 are set at active high levels. Thus, an operation to write data into the CAM cells in segments C and D of row 0 requires that GWL0=ZS_cd0=1 and NRD=0.

The first match line signal repeater ML_REP in row 0 of the quad group 200 has a data input (shown as MLi in FIG. 6A) that is electrically connected to the first match line segment ML0_a and a data output (shown as MLo in FIG. 6B) that is electrically connected to a second match line segment ML0_b. The first match line signal repeater ML_REP is responsive to a bias signal (PBIAS), an evaluation control signal EV_b and a connect control signal CON_ab. As described above with respect to FIG. 2, during a segment-to-segment search operation across row 0, a high-to-low transition of the evaluation control signal EV_b will operate to pass an early match signal, if any, from the first match line segment ML0_a to the second match line segment ML0_b. This passing of an early match signal is referred to herein as an early match capture (EMC) operation, which is synchronized with a high-to-low edge of the evaluation control signal EV_b. Thereafter, when the evaluation control signal EV_b switches low-to-high, a low-to-high transition of the connect control signal CON_ab will operate to pass a late miss signal, if any, from the first match line segment ML0_a to the second match line segment ML0_b. This passing of a late miss signal is referred to herein as a late miss capture (LMC) operation, which is synchronized with a low-to-high edge of the connect control signal CON_ab. These operations are also illustrated by the timing diagram of FIG. 3.

The second match line signal repeater ML_REP in row 0 has a data input that is electrically connected to the second match line segment ML0_b and a data output that is electrically connected to a third match line segment ML0_c. The second match line signal repeater ML_REP is responsive to the bias signal (PBIAS), an evaluation control signal EV_c and a connect control signal CON_bc. During a segment-to-segment search operation across row 0, a high-to-low transition of the evaluation control signal EV_c will operate to pass an early match signal, if any, from the second match line segment ML0_b to the third match line segment ML0_c. Thereafter, when the evaluation control signal EV_c switches low-to-high, a low-to-high transition of the connect control signal CON_bc will operate to pass a late miss signal, if any, from the second match line segment ML0_b to the third match line segment ML0_c.

Figure 2B:
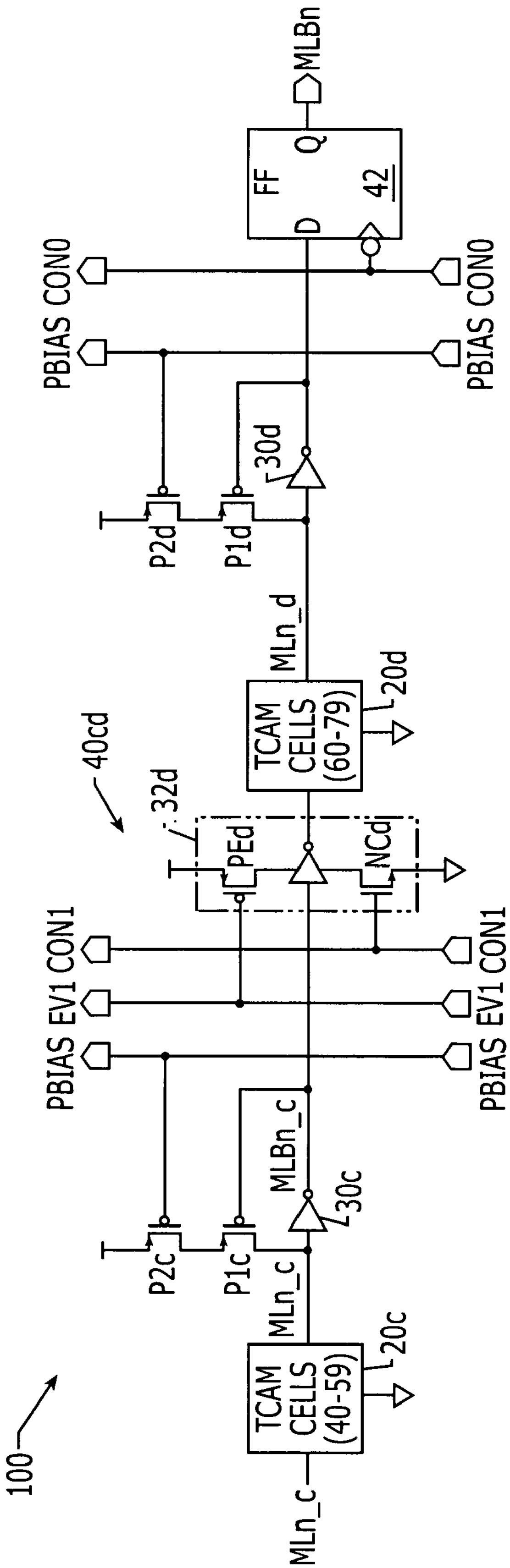

The third match line signal repeater ML_REP in row 0 has a data input that is electrically connected to the third match line segment ML0_c and a data output that is electrically connected to a fourth match line segment ML0_d. The third match line signal repeater ML_REP is responsive to the bias signal (PBIAS), an evaluation control signal EV_d and a connect control signal CON_cd. During a segment-to-segment search operation across row 0, a high-to-low transition of the evaluation control signal EV_d will operate to pass an early match signal, if any, from the third match line segment ML0_c to the fourth match line segment ML0_d. Thereafter, when the evaluation control signal EV_d switches low-to-high, a low-to-high transition of the connect control signal CON_cd will operate to pass a late miss signal, if any, from the third match line segment ML0_c to the fourth match line segment ML0_d. This fourth match line segment ML0_d corresponds to the fourth match line segment MLn_d illustrated by FIG. 2B. Moreover, although not shown in FIG. 5B, the fourth pair of serially connected PMOS pull-up transistors P1*d* and P2*d*, the final inverter 30*d* and the capture latch 42 illustrated by FIG. 2B may be provided as respective final capture circuits, which are located at the ends of each of the fourth match line segments ML0_d to ML3_d illustrated by FIG. 5B.

The match line driver ML_DR in row 1 is responsive to the evaluation control signal EV_a, a force-to-miss control signal F2M1 and the normal-row-disable signal NRD. The first match line segment ML1_a in row 1 is precharged to Vdd when the evaluation control signal EV_a switches high-to-low to commence a precharge time interval associated with row 1. If applied during a segment-to-segment search of another row (e.g., row 0, row 2 or row 3), a leading edge of the active high force-to-miss control signal F2M1 will operate to discharge the first match line segment ML1_a in row 1 or otherwise hold the first match line segment ML1_a in a discharged state.

A first word line driver WL_DR in row 1 has an output that is electrically connected to a first local word line segment WL1_ab, which spans segments A and B of row 1. This first word line driver WL_DR is responsive to a global word line control signal GWL0, the normal-row-disable signal NRD and a local word line control signal ZS_ab1. The first word line driver WL_DR in row 1 operates to drive the first local word line segment WL1_ab high only when both the global word line control signal GWL0 and the local word line control signal ZS_ab1 are set at active high levels. Thus, an operation to write a segment of data (e.g., a x40 segment) into the CAM cells in segments A and B of row 1 requires that GWL0=ZS_ab1=1. A second word line driver WL_DR in row 1 has an output that is electrically connected to a second local word line segment WL1_cd, which spans segments C and D of row 1. This second word line driver WL_DR is responsive to the global word line control signal GWL0, the normal-row-disable signal NRD and a local word line control signal ZS_cd1. The second word line driver WL_DR in row 1 operates to drive the second local word line segment WL1_cd high only when both the global word line control signal GWL0 and the local word line control signal ZS_cd1 are set at active high levels. Thus, an operation to write data into the CAM cells in segments C and D of row 1 requires that GWL0=ZS_cd1=1.

The first match line signal repeater ML_REP in row 1 of the quad group 200 has a data input that is electrically connected to the first match line segment ML1_a and a data output that is electrically connected to a second match line segment ML1_b. The second match line signal repeater ML_REP in row 1 has a data input that is electrically connected to the second match line segment ML1_b and a data output that is electrically connected to a third match line segment ML1_c. The third match line signal repeater ML_REP in row 1 has a data input that is electrically connected to the third match line segment ML1_c and a data output that is electrically connected to a fourth match line segment ML1_d. These first, second and third match line signal repeaters ML_REP in row 1 operate in similar manner to the corresponding match line signal repeaters ML_REP in row 0.

The match line driver ML_DR in row 2 is responsive to the evaluation control signal EV_a, a force-to-miss control signal F2M2 and the normal-row-disable signal NRD. The first match line segment ML2_a in row 2 is precharged to Vdd when the evaluation control signal EV_a switches high-to-low to commence a precharge time interval associated with row 2. If applied during a segment-to-segment search of another row (e.g., row 0, row 1 or row 3), a leading edge of the active high force-to-miss control signal F2M2 will operate to discharge the first match line segment ML2_a in row 2 or otherwise hold the first match line segment ML2_a in a discharged state.

A first word line driver WL_DR in row 2 has an output that is electrically connected to a first local word line segment WL2_ab, which spans segments A and B of row 2. This first word line driver WL_DR is responsive to a global word line control signal GWL1, the normal-row-disable signal NRD and a local word line control signal ZS_ab0. The first word line driver WL_DR in row 2 operates to drive the first local word line segment WL2_ab high only when both the global word line control signal GWL1 and the local word line control signal ZS_ab0 are set at active high levels. Thus, an operation to write a segment of data (e.g., a x40 segment) into the CAM cells in segments A and B of row 2 requires that GWL1=ZS_ab0=1. A second word line driver WL_DR in row 2 has an output that is electrically connected to a second local word line segment WL2_cd, which spans segments C and D of row 2. This second word line driver WL_DR is responsive to the global word line control signal GWL1, the normal-row-disable signal NRD and a local word line control signal ZS_cd0. The second word line driver WL_DR in row 2 operates to drive the second local word line segment WL2_cd high only when both the first global word line control signal GWL1 and the local word line control signal ZS_cd0 are set at active high levels. Thus, an operation to write data into the CAM cells in segments C and D of row 2 requires that GWL1=ZS_cd0=1.

The first match line signal repeater ML_REP in row 2 of the quad group 200 has a data input that is electrically connected to the first match line segment ML2_a and a data output that is electrically connected to a second match line segment ML2_b. The second match line signal repeater ML_REP in row 2 has a data input that is electrically connected to the second match line segment ML2_b and a data output that is electrically connected to a third match line segment ML2_c. The third match line signal repeater ML_REP in row 2 has a data input that is electrically connected to the third match line segment ML2_c and a data output that is electrically connected to a fourth match line segment ML2_d. These first, second and third match line signal repeaters ML_REP in row 2 operate in similar manner to the corresponding match line signal repeaters ML_REP in row 0.

The match line driver ML_DR in row 3 is responsive to the evaluation control signal EV_a, a force-to-miss control signal F2M3 and the normal-row-disable signal NRD. The first match line segment ML3_a in row 3 is precharged to Vdd when the evaluation control signal EV_a switches high-to-low to commence a precharge time interval associated with row 3. If applied during a segment-to-segment search of another row (e.g, row 0, row 1 or row 2), a leading edge of the active high force-to-miss control signal F2M3 will operate to discharge the first match line segment ML3_a in row 3 or otherwise hold the first match line segment ML3_a in a discharged state.

A first word line driver WL_DR in row 3 has an output that is electrically connected to a first local word line segment WL3_ab, which spans segments A and B of row 3. This first word line driver WL_DR is responsive to a global word line control signal GWL1, the normal-row-disable signal NRD and a local word line control signal ZS_ab1. The first word line driver WL_DR in row 3 operates to drive the first local word line segment WL3_ab high only when both the global word line control signal GWL1 and the local word line control signal ZS_ab1 are set at active high levels. Thus, an operation to write a segment of data (e.g., a x40 segment) into the CAM cells in segments A and B of row 3 requires that GWL1=ZS_ab1=1. A second word line driver WL_DR in row 3 has an output that is electrically connected to a second local word line segment WL3_cd, which spans segments C and D of row 3. This second word line driver WL_DR is responsive to the global word line control signal GWL1, the normal-row-disable signal NRD and a local word line control signal ZS_cd1. The second word line driver WL_DR in row 3 operates to drive the second local word line segment WL3_cd high only when both the first global word line control signal GWL1 and the local word line control signal ZS_cd1 are set at active high levels. Thus, an operation to write data into the CAM cells in segments C and D of row 3 requires that GWL1=ZS_cd1=1.

The first match line signal repeater ML_REP in row 3 of the quad group 200 has a data input that is electrically connected to the first match line segment ML3_a and a data output that is electrically connected to a second match line segment ML3_b. The second match line signal repeater ML_REP in row 3 has a data input that is electrically connected to the second match line segment ML3_b and a data output that is electrically connected to a third match line segment ML3_c. The third match line signal repeater ML_REP in row 3 has a data input that is electrically connected to the third match line segment ML3_c and a data output that is electrically connected to a fourth match line segment ML3_d. These first, second and third match line signal repeaters ML_REP in row 3 operate in similar manner to the corresponding match line signal repeaters ML_REP in row 0.

The quad group 200 of rows in FIG. 5 may be configured to operate in a xN search mode, where N is the logical width of the CAM array (i.e., the total number of CAM cells in first through fourth segments of CAM cells), a x2N search mode or a x4N search mode. During a xN search mode operation, each of the four rows within the quad group 200 is searched in parallel and the force-to-miss signals F2M0–F2M3 are all held at inactive levels (i.e., F2M<3:0>=<0000>).

During a x2N search mode operation, the even rows 0 and 2 within the quad group 200 may be searched in parallel to identify a first match associated with a first half of a x2N search word and then in a staggered sequence the odd rows 1 and 3 may be searched in parallel to identify a second match associated with a second half of the x2N search word. Upon commencement of the parallel search of the first segments A in even rows 0 and 2, the force-to-miss signals F2M<3:0> may be set to equal <1010> to thereby discharge the first match line segments ML1_a and ML3_a associated with rows 1 and 3 of the quad group 200. Likewise, upon commencement of the parallel search of the first segments A in odd rows 1 and 3, the force-to-miss signals F2M<3:0> may be set to equal <0101> to thereby discharge the first match line segments ML0_a and ML2_a associated with rows 0 and 2 of the quad group 200. As described more fully hereinbelow, commencement of a parallel segment-to-segment search of rows 1 and 3 may be staggered in time relative to commencement of a parallel segment-to-segment search of rows 0 and 2. As will be understood by those skilled in the art, the detection of a match condition in row 0 (row 2) and a match condition in row 1 (row 3) may be encoded as a x2N match condition by a priority encoder (not shown) that receives final match line signals MLBn from each CAM row (see, FIG. 2B).

During a x4N search mode operation, the rows 0–3 within the quad group 200 are searched one-at-a-time in a staggered sequence. Upon commencement of a search of the first segment A in row 0, the force-to-miss signals F2M<3:0> may be set to equal <1110> to thereby discharge the first match line segments ML1_a, ML2_a and ML3_a associated with rows 1–3 of the quad group 200. Likewise, upon commencement of a search of the first segment A in row 1, the force-to-miss signals F2M<3:0> may be set to equal <1101> to thereby discharge the first match line segments ML0_a, ML2_a and ML3_a associated with rows 0 and 2–3 of the quad group 200. Next, upon commencement of a search of the first segment A in row 2, the force-to-miss signals F2M<3:0> may be set to equal <1011> to thereby discharge the first match line segments ML0_a, ML1_a and ML3_a associated with rows 0–1 and 3 of the quad group 200. Finally, upon commencement of a search of the first segment A in row 3, the force-to-miss signals F2M<3:0> may be set to equal <0111> to thereby discharge the first match line segments ML0_a, ML1_a and ML2_a associated with rows 0–2 of the quad group 200.

The above described xN, x2N and x4N search modes that may be performed in the quad group 200, can be expanded to include xN, x2N, x4N and x8N search modes in the event a pair of CAM arrays (e.g., mirror-image CAM arrays) are configured to share a common priority encoder (not shown), which may be located in spine region extending between two adjacent CAM arrays (e.g., left-side and right-side CAM arrays). Thus, the illustrated quad group 200 may be combined within a mirror-image quad group in order to support a greater range of search word lengths (e.g., x80, x160, x320 and x640).

Figure 6D:
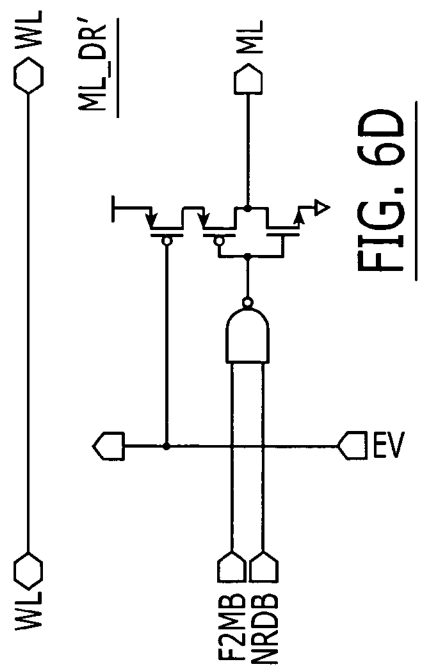
FIG. 6D is an electrical schematic of an alternative match line driver (ML_DR') according to embodiments of the present invention. This alternative match line driver (ML_DR') is responsive to an active low force-to-miss signal.
Figure 8A:
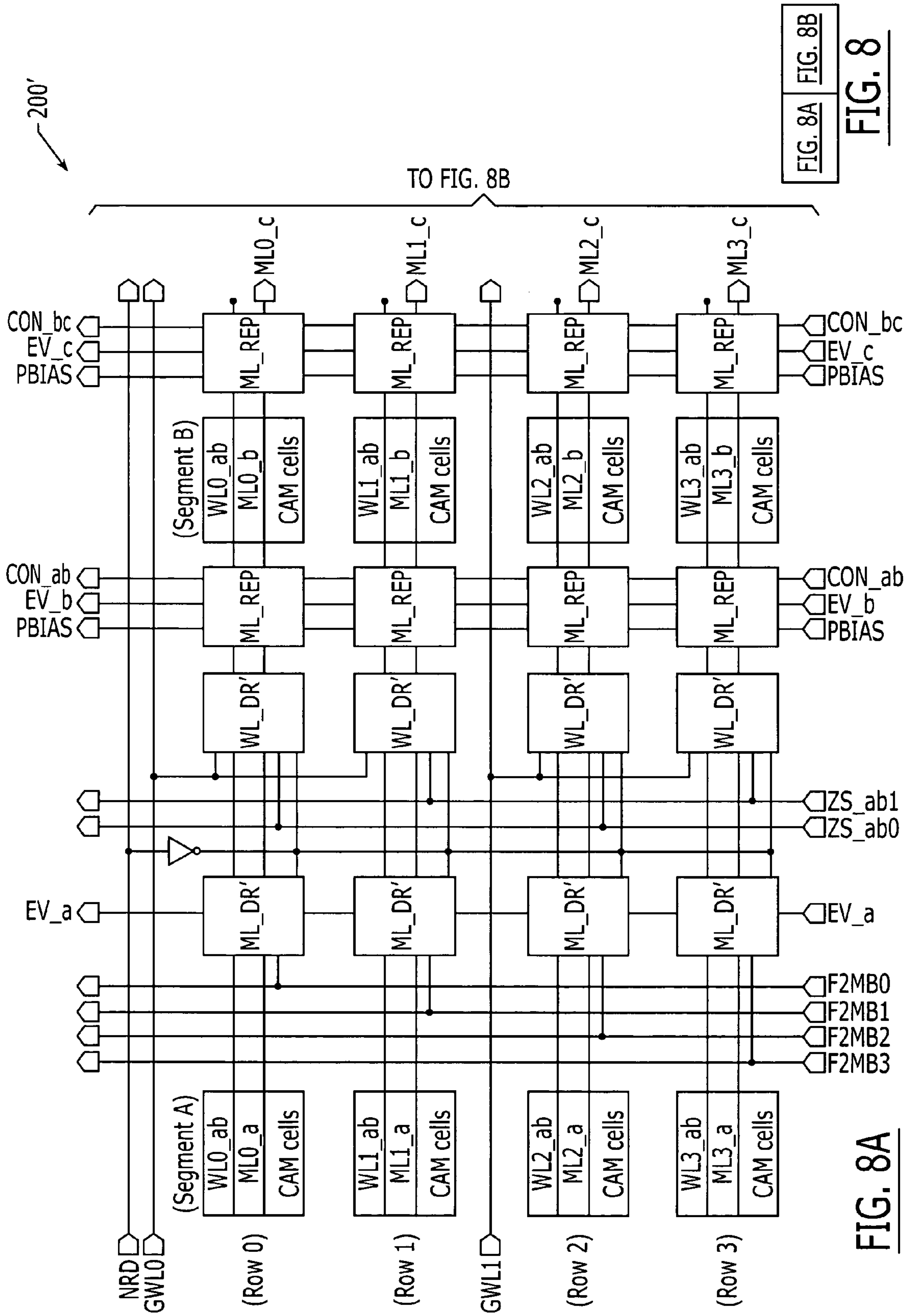
FIG. 8 is an electrical schematic of an alternative quad group of rows of CAM cells within a segmented CAM array, according to embodiments of the present invention. These rows of CAM cells use the match line driver ML_DR' of FIG. 6D to conserve match line power.
Figure 8B:
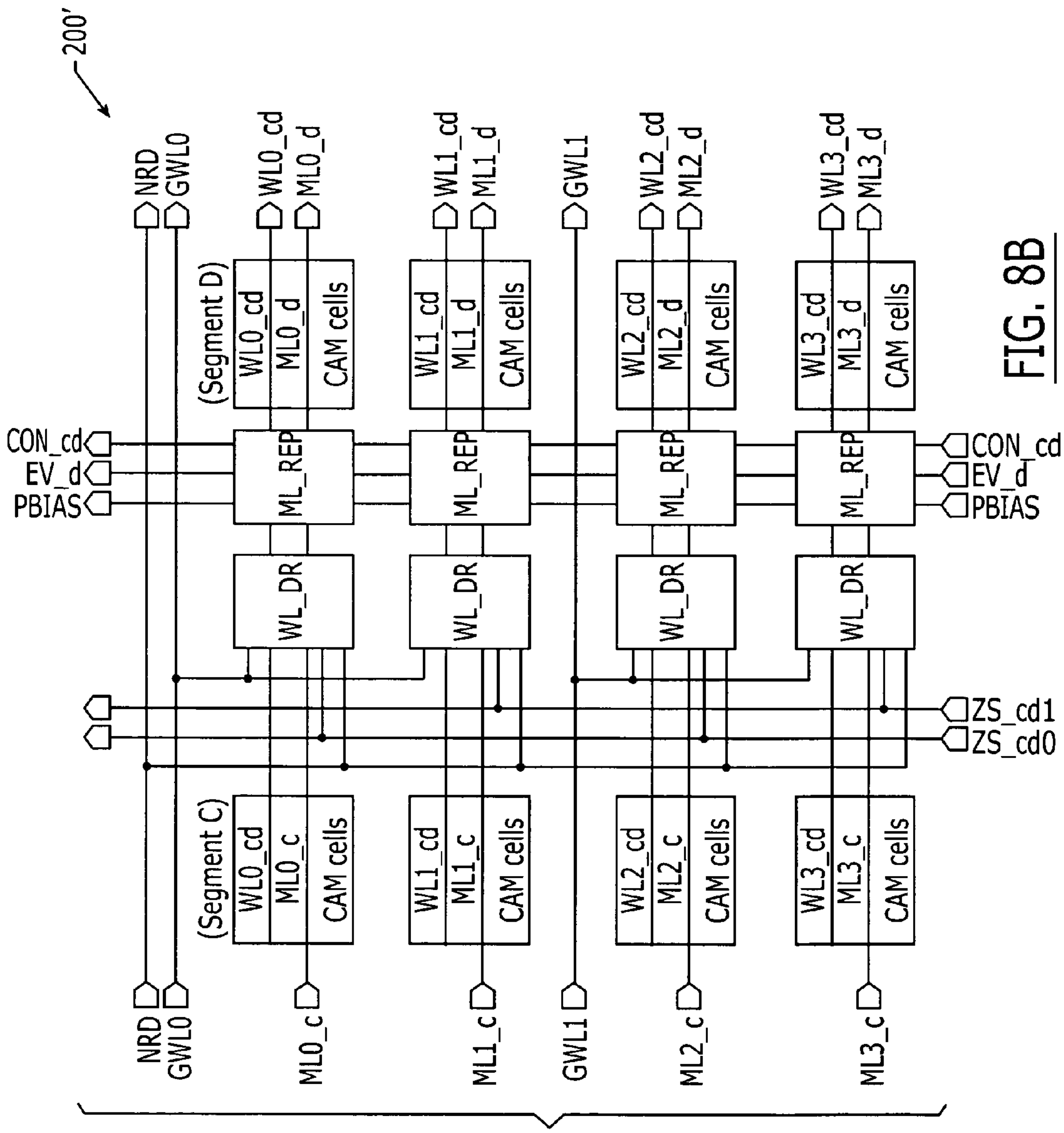

FIG. 8 illustrates an alternative quad group 200' of rows that is similar to the quad group 200 of FIG. 5. However, the match line driver circuits (ML_DR') illustrated by FIGS. 6D and 8A are not equivalent to the match line driver circuits ML_DR illustrated by FIGS. 5A and 6C. In particular, the match line driver circuits ML_DR' in FIGS. 6D and 8A provide enhanced power saving benefits relative to the match line driver circuits ML_DR illustrated by FIGS. 5A and 6C, which occupy less area. This power savings advantage is best illustrated by FIG. 6D, which shows a match line driver circuit ML_DR' having a selective precharge feature. When the respective force-to-miss signal F2MB is set low, the match line ML output will be held at a logic 0 level even when a trailing edge (i.e., high-to-low edge) of the evaluation control signal EV is received. Thus, rather than precharging all four of the first match line segments ML0_a, ML0_b, ML0_c and ML0_d in response to a leading edge of the evaluation control signal EV_a and then immediately thereafter discharging three of the four match line segments by switching three of the four force-to-match control signals F2M<3:0> high during a x4N (or x8N) search mode, as described above with respect to FIG. 5A, only a selected one of the first match line segments ML0_a, ML0_b, ML0_c or ML0_d in FIG. 8A is precharged at the commencement of a respective search operation during a x4N (or x8N) search mode. For example, switching F2MB0 low-to-high (when NRDB is high) will operate to selectively precharge only the first match line segment ML0_a in row 0 when the evaluation control signal EV_a is switched high-to-low. Thus, it is not necessary to precharge and then immediately discharge three of the four first match line segments at the commencement of each search operation during a x4N (or x8N) search mode.

The match line driver circuits ML_DR' of FIGS. 6D and 8A may be disabled by setting signal line NRD to a logic 1 level. Setting the signal line NRD causes signal line NRDB to be set to a logic 0 level, which operates to clamp the first match line segments ML0_a, ML0_b, ML0_c or ML0_d at logic 0 levels during all search operations and thereby disable the entire quad group 200'. With the exception of the match line driver circuits ML_DR' of FIG. 8A, the operation of the quad group 200' of FIG. 8 is otherwise equivalent to the operation of the quad group 200 of FIG. 5.

Figure 7:
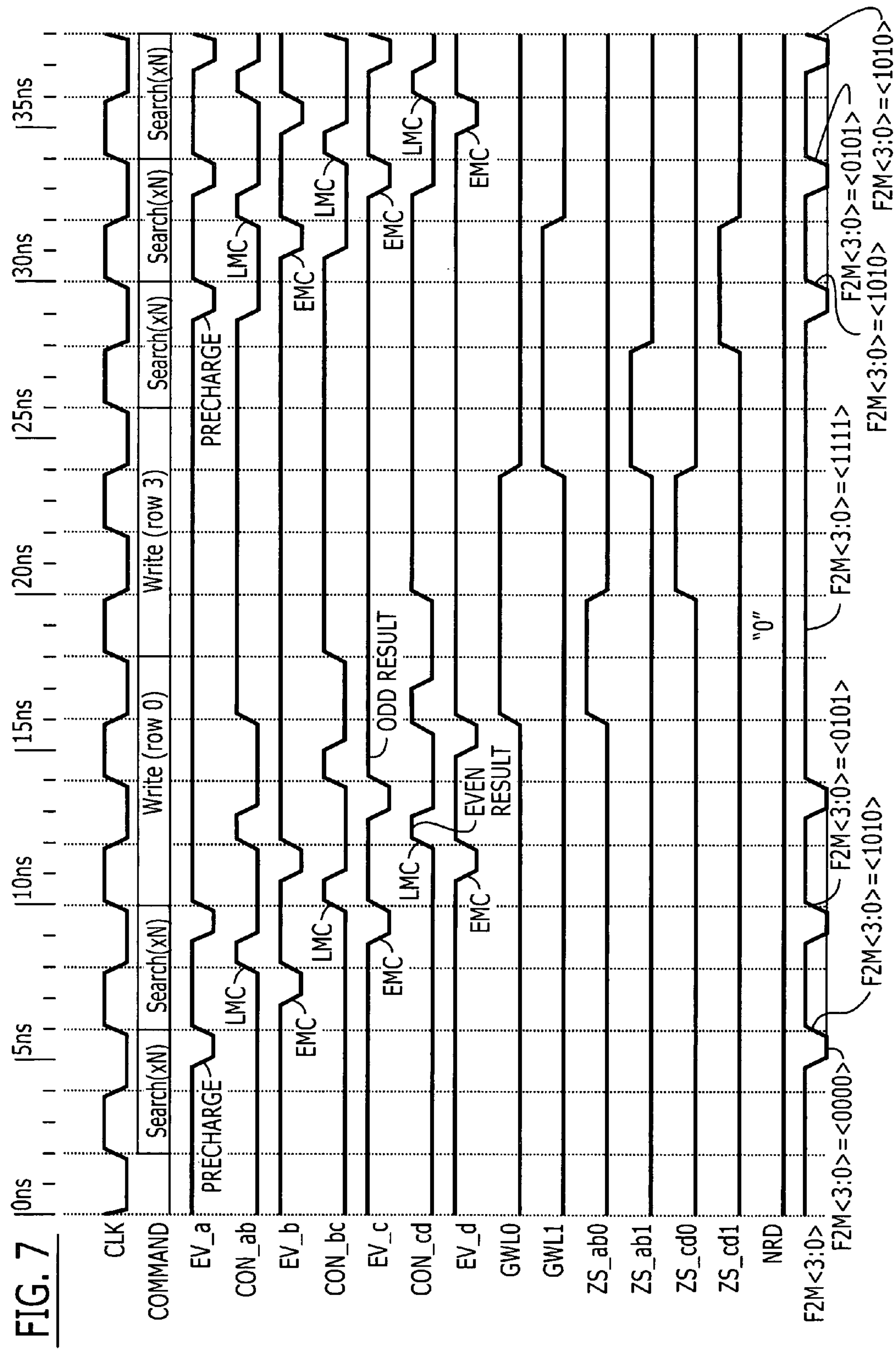
FIG. 7 is a timing diagram that illustrates operation of the segmented CAM array of FIG. 5 when performing pipelined search and read/write operations that are interleaved. Many of the signals illustrated by FIG. 7 are analogous to those illustrated in the timing diagram of FIG. 3.

FIG. 7 is a diagram that illustrates the timing of search and write operations that may be performed by a CAM array block having multiple quad groups of rows therein, which are illustrated by FIG. 5. In particular, the timing diagram of FIG. 7 illustrates the sequential interleaved performance of the following operations: first and second halves of a x2N search operation, a write operation into row 0, a write operation into row 3 and first and second halves of another x2N search operation. As illustrated, these operations may be synchronized with a clock signal CLK. In the event the CAM array block includes a pair of CAM arrays, then each x2N search operation may actually correspond to one side of a x4N search operation (e.g., x320 search, where N=80). As described hereinbelow, the prefix "MLe" refers to an even match line segment(s) (i.e., MLN, where n= 0, 2, 4, . . . , 1022) and the prefix "MLo" refers to an odd match line segment(s) (i.e., MLN, where n=1, 3, 5, . . . , 1023).

In FIG. 7, the time interval from t=2 ns to t=10 ns illustrates the receipt of two xN search commands that make up a x2N search operation. In response to these commands, a long word search is performed as a plurality of overlapping segment-to-segment search operations. These search operations are performed across different rows within a group of rows in the CAM array and are staggered in time relative to one another as will now be described. The time interval from 5 ns to 6 ns illustrates a trailing edge of the evaluation control signal EV_a. As described above with respect to FIGS. 5A and 6C, this trailing edge of the evaluation control signal EV_a, which overlaps with a trailing edge of the force-to-miss control signal F2M<3:0>, results in a precharge of the first match line segments MLn_a in rows 0–3 of the quad group 200 (and other groups of rows in the CAM array (not shown)). A leading edge of the evaluation control signal EV_a, which occurs during the time interval from 6 ns to 7 ns, marks the beginning of segment-to-segment search operations associated with the even rows of the CAM array (e.g., rows 0, 2, . . . , 1022). This leading edge of the evaluation control signal EV_a may correspond to the application of a first segment of data to data lines (not shown) associated with the first segment (segment A) of the CAM array and the evaluation of that applied data for match or miss conditions. Details of these application and evaluation operations are illustrated more fully by FIG. 3 and TABLE 2. During this time interval from 6 ns to 7 ns, the force-to-miss signal F2M<3:0> is switched to <1010> to thereby force discharge of the first match line segments ML1_a and ML3_a associated with the odds rows of the quad group 200.

When the evaluation control signal EV_b switches high-to-low at t= 7 ns, operations are performed by the corresponding match line signal repeaters ML_REP to capture early match signals (i.e., perform "early match capture" (EMC)), if any, from the even first match line segments MLe_a. These early match signals, if any, are passed as logic 1 signals to corresponding ones of the even second match line segments MLe_b. Then, during the time interval from 8 ns to 9 ns, the connect control signal CON_ab switches low-to-high to thereby enable the late capture of miss signals (i.e., perform "late miss capture" (LMC)), if any, from respective even first match line segments MLe_a. This LMC operation is performed while the second segments of CAM cells in the even rows are being searched and the "forced" miss signals from the odd rows are being passed from the odd first match line segments MLo_a to the odd second match line segments MLo_b (by corresponding match line signal repeaters in the odd rows).

At time t=9 ns, the evaluation control signal EV_a is again switched high-to-low to thereby precharge all of the first match line segments MLn_a in rows 0–3 in the quad group (and other quad groups) and prepare for the segment-to-segment search operations associated with the odd rows (e.g., rows 1, 3, 5, . . . , 1023). Commencement of these segment-to-segment operations in the odd rows is therefore delayed relative to commencement of the segment-to-segment operations in the even rows. In alternative embodiments, the sequence of even rows first and odd rows second may be reversed. Next, at t=10 ns, the evaluation control signal EV_a is switched low-to-high to commence the first segment of the segment-to-segment search operations associated with the odd rows. In addition, the force-to-miss signal F2M<3:0> is switched to <0101> to thereby discharge the first match line segments MLe_a in the even rows.

The time interval from 9 ns to 11 ns includes the passing of match line signals from the even second match line segments MLe_b to the even third match line segments MLe_c, in-sync with the evaluation control signal EV_c and the connect control signal CON_bc. These control signals also operate to pass "forced" miss signals from the odd second match line segments MLo_b to the odd third match line segments MLo_c. Next, the time interval from 11 ns to 13 ns includes the passing of match line signals from the even third match line segments MLe_c to the even fourth match line segments MLe_d, in-sync with the evaluation control signal EV_d and the connect control signal CON_cd. These control signals also operate to pass "forced" miss signals from the odd third match line segments MLo_c to the odd fourth match line segments MLo_d. These operations also include global masking and other operations that are described in detail in TABLE 2.

The time interval from 11 ns to 13 ns also includes the passing of match line signals from the odd first match line segments MLo_a to the odd second match line segments MLo_b, in-sync with the evaluation control signal EV_b and the connect control signal CON_ab. These control signals also operate to pass "forced" miss signals from the even first match line segments MLe_a to the even second match line segments MLe_b. The time interval from 13 ns to 15 ns includes the passing of match line signals from the odd second match line segments MLo_b to the odd third match line segments MLo_c, in-sync with the evaluation control signal EV_c and the connect control signal CON_bc. These control signals also operate to pass "forced" miss signals from the even second match line segments MLe_b to the even third match line segments MLe_c. Finally, the time interval from 15 ns to 17 ns includes the passing of match line signals from the odd third match line segments MLo_c to the odd fourth match line segments MLo_d, in-sync with the evaluation control signal EV_d and the connect control signal CON_cd. These control signals also operate to pass "forced" miss signals from the even third match line segments MLe_c to the even fourth match line segments MLe_d.

Upon completion of these even row and odd row segment-to-segment search operations, which are staggered relative to each other, a priority encoder (not shown) may evaluate the presence of a final match condition in a even row (e.g., row 2) and a final match condition in a next higher odd row (e.g., row 3) as a x2N match result. In the event left and right CAM arrays in a pair are used to perform a x4N search operation, then the priority encoder may evaluate the presence of final match conditions in corresponding even rows (e.g., row 2 (left CAM) and row 2 (right CAM)) and the presence of final match conditions in next higher odd rows (e.g., row 3 (left CAM) and row 3 (right CAM)) as a x4N match result. In a similar manner, the time intervals from t=26 ns to 34 ns illustrate the receipt of two xN search words that collectively support another x2N search operation.

The above described segment-to-segment search operations that collectively define a long word search operation may be efficiently pipelined with other operations, including operations to read an entry from a CAM array and write a new entry into a CAM array. FIG. 7 highlights two write operations, which are performed in response to a first write command to row 0 (during the time interval from 10 ns to 18 ns) and a second write command to row 3 (during the time interval from 18 ns to 26 ns). During these time intervals, the force-to-miss signals F2M<3:0> are set to <1111> to force a miss condition on the match line segments.

Among other things, the first write command with result in a simultaneous low-to-high switching of the global word line control signal GWL0 and the local word line control signal ZS_ab0 at t=16 ns. When this occurs, the first word line segment WL0_ab in row 0 will be made active to thereby cause the CAM cells (and possibly other memory cells) in segments A and B of row 0 to receive one-half of a new CAM entry. The first write command will also result in a high-to-low switching of the local word line control signal ZS_ab0 and the low-to-high switching of the local word line control signal ZS_cd0 at t=20 ns. When this occurs, the second word line segment WL0_cd in row 0 will be made active to thereby cause the CAM cells (and possibly other memory cells) in segments C and D of row 0 to receive a second-half of the new CAM entry.

The second write command results in a simultaneous low-to-high switching of the global word line control signal GWL1 and the local word line control signal ZS_ab1 at t=24 ns. When this occurs, the first word line segment WL3_ab in row 3 will be made active to thereby cause the CAM cells in segments A and B of row 3 to receive one-half of a new CAM entry. The second write command will also result in a high-to-low switching of the local word line control signal ZS_ab1 and the low-to-high switching of the local word line control signal ZS_cd1 at t=28 ns. When this occurs, the second word line segment WL3_cd in row 3 will be made active to thereby cause the CAM cells in segments C and D of row 3 to receive a second-half of the new CAM entry.

Figures 9A, 9B, 9C, 9D:
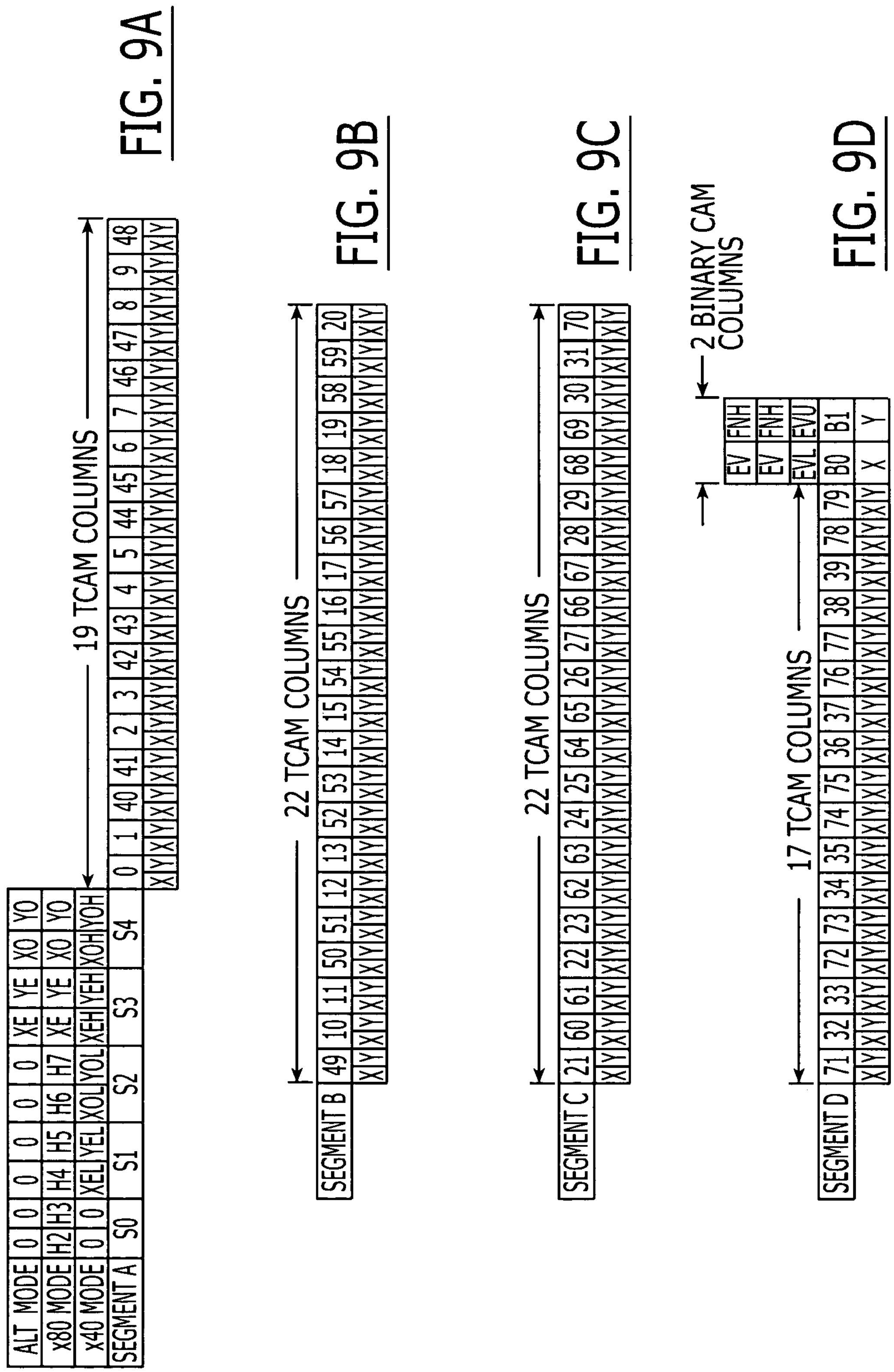
FIG. 9A illustrates an arrangement of check bit cells and XY ternary CAM cells associated with a first segment of a CAM array, according to embodiments of the present invention.
FIG. 9B illustrates an arrangement of XY ternary CAM cells within a second segment of a CAM array, according to embodiments of the present invention.
FIG. 9C illustrates an arrangement of XY ternary CAM cells within a third segment of a CAM array, according to embodiments of the present invention.
FIG. 9D illustrates an arrangement of XY ternary CAM cells and binary CAM cells (valid bit cell and force-no-hit bit cell) associated with a fourth segment of a CAM array, according to embodiments of the present invention.

As illustrated by FIG. 9A, segment A of a CAM array may be configured to support ternary CAM cells (TCAM cells) in addition to various other memory cells. These additional memory cells may include SRAM cells and dual-function check bit cells that provide column redundancy. The use of dual-function check bit cells is described more fully in commonly assigned U.S. application Ser. Nos. 10/619,635, filed Jul. 15, 2003 and 10/619,638, filed Jul. 15, 2003, the disclosures of which is hereby incorporated herein by reference. The TCAM cells in segment A are illustrated as spanning 19 columns. To achieve a high level of soft error immunity and reduce power consumption, the order of the columns of TCAM cells is mixed. In particular, the TCAM cells in segment A are provided in the following sequence: {0,1,40,41,2,3,42,43,4,5,44, 45,6,7,46,47,8,9,48}. Based on this sequence, a search of segment A during a xN search operation will result in the application of bits 0,1,40,41,2, 3,42,43,4,5,44,45,6,7,46,47,8,9 and 48 of a search word to the data lines (D and DB) associated with segment A.

When the CAM device is disposed in the ALT_MODE, columns S3 and S4 within segment A may support 4-bits of parity data. These 4-bits of parity data may be stored within four SRAM cells that occupy the same layout area as two TCAM cells (shown as lateral XY TCAM cells). One or more of these SRAM cells may constitute a dual-function check bit cell. The layout of an exemplary TCAM cell is more fully described in commonly assigned U.S. application Ser. No. 10/609,756, filed Jun. 30, 2003, the disclosure of which is hereby incorporated herein by reference. The four bits of parity data are labeled as: XE, YE, XO and YO. The label XE refers to the parity of the "even" X-bits within a CAM entry (i.e., the parity of the following bits: $X_0$, $X_2$, $X_4$, $X_6$, $X_8$, . . . , $X_{78}$). The label YE refers to the parity of the "even" Y-bits within a CAM entry (i.e., the parity of the following bits: $Y_0$, $Y_2$, $Y_4$, $Y_6$, $Y_8$, . . . , $Y_{78}$). The label XO refers to the parity of the "odd" X-bits within a CAM entry (i.e., the parity of the following bits: $X_1$, $X_3$, $X_5$, $X_7$, $X_9$ . . . , $X_{79}$). The label YO refers to the parity of the "odd" Y-bits within a CAM entry (i.e., the parity of the following bits: $Y_1$, $Y_3$, $Y_5$, $Y_7$, $Y_9$, . . . , $Y_{79}$). Based on the illustrated arrangement of the TCAM cells in FIGS. 9A–9D and the definition of the four parity bits, the presence of a soft error across four adjacent memory elements within the same row (e.g., $X_0$, $Y_0$, $X_1$, $Y_1$) will still be detectable during error detection operations using only one bit of parity for each even and odd X-bit and Y-bit words.

When the CAM device is disposed in the x80 MODE identified by FIG. 9A, six additional bits of data are retained within each CAM entry. These six additional bits of data, which are illustrated as: H2, H3, H4, H5, H6 and H7, represent Hamming code bits that support error detection and correction operations. In particular, the six bits of Hamming code may be combined with the four bits of parity data (XE, YE, XO, YO) to yield an 8-bit check word because the four bits of parity data operate as two additional Hamming code bits that have been unfolded. These eight bits of Hamming code are sufficient to meet the following requirement: $2^c<N+c+1<2^{c-1}$, where "c" represents the length of the check word (e.g., 8 bits) and N represents the number of bits of data in a CAM entry (e.g., 80X bits+80 Y bits+entry valid bit+"force no hit" bit=162 bits of data). These error detection and correction operations are more fully described in the aforementioned '635 and '638 applications. These six additional bits of data may be retained by six SRAM cells that occupy the same layout area as three TCAM cells.

When the CAM device is disposed in the x40 MODE identified by FIG. 9A, eight bits of parity data are retained within each CAM entry. These eights bits of parity data are identified by the following labels: XEL, YEL, XOL, YOL, XEH, YEH, XOH and YOH. These eight bits are divided into four bits of parity data for a "low" word (L) and four bits of parity data for a "high" word (H). In the illustrated embodiment, a "low" word corresponds to bits 0–39 of a CAM entry and a "high" word corresponds to bits 40–79 of a CAM entry.

The arrangement of CAM cells in segments B and C is illustrated by FIGS. 9B and 9C. In particular, FIG. 9B illustrates the following sequence of 22 TCAM cells in segment B: {49,10,11,50,51,12,13,52,53,14,15,54,55, 16,17,56,57,18,19,58,59,20}. FIG. 9C illustrates the following sequence of 22 TCAM cells in segment C: {21,60,61, 22,23,62,63,24,25,64,65,26,27,66, 67,28,29,68,69,30,31,70}.

FIG. 9D illustrates the remaining 17 TCAM cells within segment D. In addition, FIG. 9D illustrates the location of two binary (B) CAM cells, which are identified by columns B0 and B1. When the CAM device is disposed in the ALT_MODE or x80 MODE, the CAM cell in column B0 retains an "entry valid" (EV) bit and the CAM cell in column B1 retains a "force no hit" (FNH) bit. The EV bit may be set to a logic 1 value to indicate that the CAM entry is valid. Accordingly, during search operations, the data lines associated with column B0 may be set to represent a logic 1 value so that each search is only made on valid entries. Alternatively, when the CAM device is disposed in the x40 MODE, the binary CAM cells in column B0 and B1 retain the entry valid (EV) bit for the "low" word (L) and the entry valid (EV) bit for the "high" word (H).

Figure 10A:
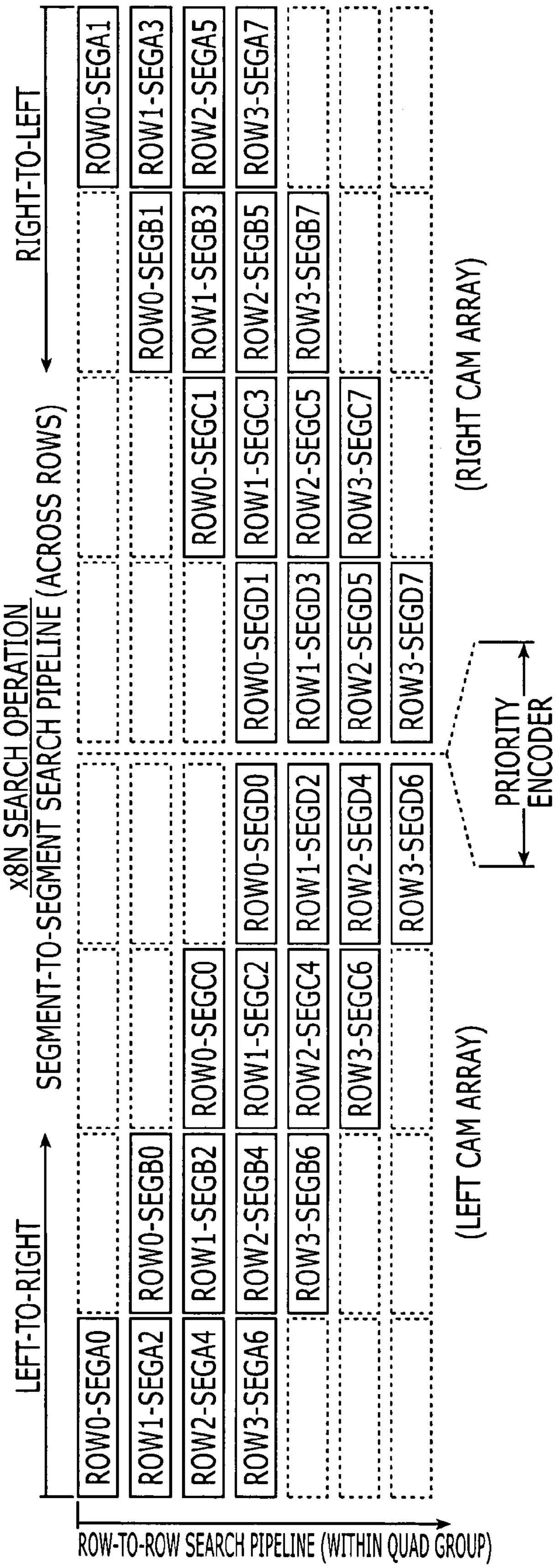
FIG. 10A is a block diagram that illustrates a sequence of segment-to-segment search operations in combination with a sequence of row-to-row search operations that are performed by a pair of CAM arrays during a two-dimensional long word search operation (e.g., x8N), according to embodiments of the present invention.

FIG. 10A illustrates the two-dimensional (2D) pipelined nature of a long word (e.g., x8N) search operation within a pair of CAM arrays. This 2D pipeline includes a "vertical" row-to-row search pipeline across four rows within a quad group (rows 0–3) and a "horizontal" segment-to-segment search pipeline across the rows within the quad group. Each x8N entry includes eight words: WORD0–WORD7. The even words (WORD0, WORD2, WORD4 and WORD6) are located in immediately adjacent rows in the left-side CAM array and the odd words (WORD1, WORD3, WORD5 and WORD7) are located in corresponding rows in the right-side CAM array. In FIG. 10A, the blocks identified as "ROW0" represent the left-to-right and right-to-left segment-to-segment search operations that are performed across rows 0 in left and right arrays. Similarly, the blocks identified as "ROW1" represent the left-to-right and right-to-left segment-to-segment search operations that are performed across rows 1 in left and right arrays. These operations in rows 1 are illustrated as commencing at about the same time as the operations to search segments B0 and B1 in rows 0 are commenced. The blocks identified as "ROW2" represent the left-to-right and right-to-left segment-to-segment search operations that are performed across rows 2 in left and right arrays. These operations in rows 2 are illustrated as commencing at about the same time as the operations to search segments B2 and B3 in rows 1 are commenced. Finally, the blocks identified as "ROW3" represent the left-to-right and right-to-left segment-to-segment search operations that are performed across rows 3 in left and right arrays. These operations in rows 3 are illustrated as commencing at about the same time as the operations to search segments B4 and B5 in rows 2 are commenced.

Figure 10B:
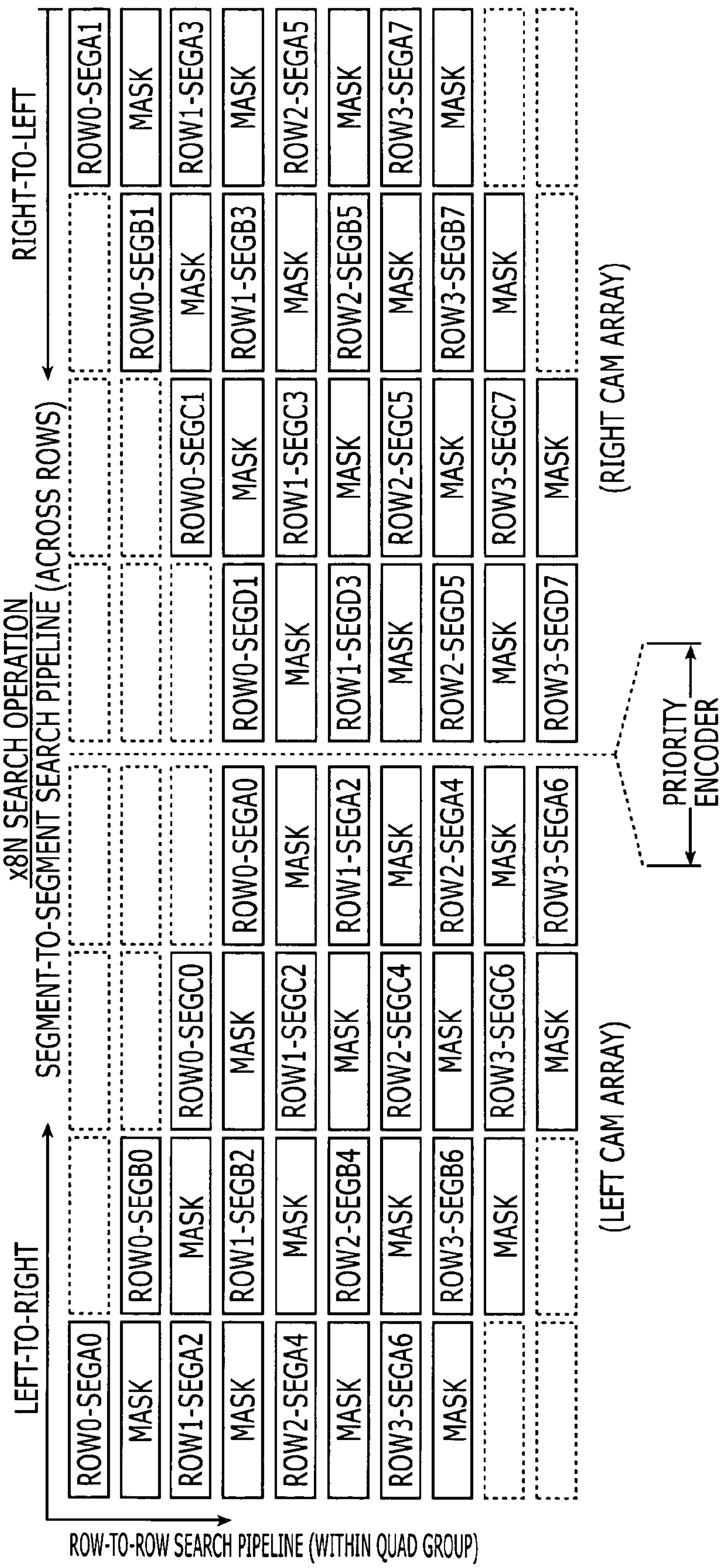
FIG. 10B is a block diagram that illustrates a sequence of segment-to-segment search operations in combination with a sequence of row-to-row search operations that are performed by a pair of CAM arrays during a long word search operation (e.g., x8N), according to embodiments of the present invention.

The two-dimensional (2D) pipelined nature of a long word (e.g., x8N) search operation illustrated by FIG. 10B corresponds closely to the operations described above with respect to FIGS. 5–8 and illustrated in TABLES 2–3. These operations include global masking operations (shown as MASK) that are performed within each segment-to-segment search operation. The blocks identified as "ROW0" represent the left-to-right and right-to-left segment-to-segment search operations that are performed across rows 0 in left and right arrays. The blocks identified as "ROW1" represent the left-to-right and right-to-left segment-to-segment search operations that are performed across rows 1 in left and right arrays. These operations in rows 1 are illustrated as commencing at about the same time as the operations to search segments C0 and C1 in rows 0 are commenced. The blocks identified as "ROW2" represent the left-to-right and right-to-left segment-to-segment search operations that are performed across rows 2 in left and right arrays. These operations in rows 2 are illustrated as commencing at about the same time as the operations to search segments C2 and C3 in rows 1 are commenced. Finally, the blocks identified as "ROW3" represent the left-to-right and right-to-left segment-to-segment search operations that are performed across rows 3 in left and right arrays. These operations in rows 3 are illustrated as commencing at about the same time as the operations to search segments C4 and C5 in rows 2 are commenced. Finally, FIG. 10C illustrates a repeating sequence of consecutive x8N search operations illustrated by FIG. 10B, but with a vertical column showing the timing of the horizontal segment-to-segment search operations and vertical row-to-row search operations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising: a segmented CAM array configured to support a long word search operation as a plurality of overlapping segment-to-segment search operations that are each performed across different rows within a group of rows in the CAM array and staggered in time relative to one another.

2. The device of claim 1, wherein the plurality of overlapping segment-to-segment search operations includes a first segment-to-segment search operation performed in a first row in the group of rows and a second segment-to-segment search operation performed in a second row in the group of rows; and wherein commencement of the second segment-to-segment search operation is delayed in time relative to commencement of the first segment-to-segment search operation by one or two search segment time intervals.

3. The device of claim 2, wherein upon commencement of the second segment-to-segment search operation, a precharged first match line segment in the first row is discharged in response to a leading edge of a force-to-miss control signal.

4. The device of claim 2, wherein the second segment-to-segment search operation is preceded by the step of precharging a first match line segment in the second row while simultaneously discharging a corresponding first match line segment in the first row.

5. The device of claim 1, wherein a first row within the group of rows comprises:

first and second match line segments; and a match line driver electrically coupled to the first match line segment and responsive force-to-miss control signal.

6. The device of claim 5, wherein the first row further comprises:

a match line signal repeater having an input electrically connected to the first match line segment and an output electrically connected to the second match line segment.

7. The device of claim 5, wherein the first row further comprises:

a dual-capture match line signal repeater having an input electrically connected to the first match line segment and an output electrically connected to the second match line segment.

8. The device of claim 5, wherein said match line driver is configured to electrically short the first match line segment to a ground reference potential in response to a leading edge of the force-to-miss control signal.

9. The device of claim 8, wherein said match line driver is configured to precharge the first match line segment in response to a trailing edge of an evaluation control signal.

10. An integrated circuit device, comprising:

a CAM array block having a segmented xN CAM array therein configured to support one-half of a x8N search operation as four overlapping segment-to-segment search operations that are performed in a staggered sequence across different rows within a quad group of rows in the CAM array.

11. The device of claim 10, wherein a first one of the quad group of rows comprises:

a first segment of CAM cells;

a first match line segment electrically connected to the first segment of CAM cells; and a match line driver electrically connected to said first match line segment, said match line driver configured to precharge said first match line segment in response to an edge of a control signal and discharge said first match line segment in response to an edge of a force-to-miss control signal.

12. The device of claim 10, wherein each of the rows in the quad group is responsive to a respective force-to-miss control signal.

13. An integrated circuit device, comprising:

a CAM array having a segmented row of CAM cells therein that comprises:

first and second segments of CAM cells;

first and second match line segments electrically connected to said first and second segments of CAM cells, respectively;

a match line driver configured to precharge said first match line segment in response to an edge of a control signal and is responsive to a force-to-miss control signal; and a dual-capture match line signal repeater having an input electrically coupled to said first match line segment and an output electrically coupled to said second match line segment.

14. The device of claim 13, wherein said match line driver is configured to discharge said first match line segment in response to a leading edge of the force-to-miss control signal.

15. An integrated circuit device, comprising:

a CAM array having a row of CAM cells therein, said row of CAM cells comprising:

first and second local word line drivers responsive to first and second local word line control signals, respectively, and a global word line control signal; and first and second segments of CAM cells electrically coupled to the first and second local word line drivers, respectively.

16. The device of claim 15, wherein said CAM array has another row of CAM cells therein that comprises third and fourth local word line drivers, which are responsive to third and fourth local word line control signals, respectively, and third and fourth segments of CAM cells electrically coupled to the third and fourth word line drivers, respectively; and wherein the third and fourth local word line drivers are responsive to the same global word line control signal as the first and second local word line drivers.

17. An integrated circuit device, comprising:

a CAM array having a row of lateral XY TCAM cells therein arranged in a repeating low-even, low-odd, high-even, high-odd sequence or a repeating high-even, high-odd, low-even, low-odd sequence.

18. An integrated circuit device, comprising:

a segmented CAM array configured to support pipelined long word search operations in segment-to-segment and row-to-row search directions using a plurality of force-to-miss control signals to identify which rows are to be searched in the row-to-row pipeline direction.

19. A method of operating an integrated circuit device, comprising the step of:

staggering the timing of overlapping segment-to-segment search operations across different rows within a CAM array using force-to-miss control signals to establish miss conditions on match lines of rows that are not participating in respective ones of the segment-to-segment search operations.

* * * * *